(12) United States Patent
Zhang et al.

(10) Patent No.: US 7,782,408 B2
(45) Date of Patent: Aug. 24, 2010

(54) 3-D MOLECULAR ASSEMBLY AND ITS APPLICATIONS FOR MOLECULAR DISPLAY AND MOLETRONICS

(75) Inventors: Xiao-An Zhang, Sunnyvale, CA (US); Sui-Hing Leung, Cupertino, CA (US); Kent D. Vincent, Cupertino, CA (US); Zhang-Lin Zhou, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1129 days.

(21) Appl. No.: 10/614,855

(22) Filed: Jul. 7, 2003

(65) Prior Publication Data
US 2005/0008321 A1 Jan. 13, 2005

(51) Int. Cl.
*G02F 1/13* (2006.01)
(52) U.S. Cl. .......................................................... 349/1
(58) Field of Classification Search ..................... 349/58
See application file for complete search history.

(56) References Cited

U.S. PATENT DOCUMENTS

| | | | | |
|---|---|---|---|---|
| 5,275,924 A * | 1/1994 | Devonald et al. | ......... | 430/495.1 |
| 5,866,284 A | 2/1999 | Vincent | | |
| 6,045,955 A | 4/2000 | Vincent | | |
| 6,512,119 B2 * | 1/2003 | Bratkovski et al. | .......... | 546/104 |
| 6,556,470 B1 * | 4/2003 | Vincent et al. | ............... | 365/151 |
| 6,624,002 B2 | 9/2003 | Bratkovski et al. | | |
| 6,663,797 B2 * | 12/2003 | Bratovski et al. | ........... | 252/500 |
| 6,670,981 B1 | 12/2003 | Vincent et al. | | |
| 6,674,932 B1 | 1/2004 | Zhang et al. | | |
| 6,701,035 B2 | 3/2004 | Zhang et al. | | |
| 6,731,532 B2 | 5/2004 | Vincent et al. | | |
| 6,751,365 B2 | 6/2004 | Zhang et al. | | |
| 6,757,457 B1 | 6/2004 | Zhang et al. | | |
| 6,763,158 B1 * | 7/2004 | Zhang et al. | ................... | 385/16 |

(Continued)

FOREIGN PATENT DOCUMENTS

WO    WO 02/089229    11/2002

OTHER PUBLICATIONS

Kornilovitch, P.E., et al.: "Bistable Molecular Conductors with a Field-Switchable Dipole Group", Phys. Rev . . . , Am. Institute of Physics, NY, US, vol. 66, No. 24, Dec. 15, 2002.

(Continued)

*Primary Examiner*—Timothy Rude
(74) *Attorney, Agent, or Firm*—David W. Collins

(57) ABSTRACT

A three-dimensional molecular assembly and method of formation are provided. The molecular assembly is formed on a substrate. The molecular assembly comprises: a first monolayer of seed molecules for initiating self-assembled molecular growth, the first monolayer formed on the substrate; a second monolayer of active molecules comprising a plurality of rotor and stator moieties, with one rotor moiety supported between two stator moieties, the second monolayer of active molecules formed on the first monolayer of seed molecules, with a one-to-one correspondence between molecules in the first monolayer and the second monolayer; a third monolayer of spacer molecules, formed on the second monolayer of active molecules, with a one-to-one correspondence between molecules in the second monolayer and the third monolayer; and a plurality of alternating second monolayers and third monolayers having the one-to-one correspondence.

40 Claims, 14 Drawing Sheets

U.S. PATENT DOCUMENTS

| | | |
|---|---|---|
| 6,778,165 B2 | 8/2004 | Hubby et al. |
| 6,795,230 B1 | 9/2004 | Vincent et al. |
| 6,805,817 B2 | 10/2004 | Zhang et al. |
| 6,806,453 B1 | 10/2004 | Vincent et al. |
| 6,809,956 B2 | 10/2004 | Vincent et al. |
| 6,815,706 B2 | 11/2004 | Li et al. |
| 6,822,893 B2 | 11/2004 | Vincent et al. |
| 6,850,230 B1 | 2/2005 | Vincent et al. |
| 6,853,478 B2 | 2/2005 | Vincent et al. |
| 6,853,577 B2 * | 2/2005 | Vincent et al. .............. 365/151 |
| 6,867,427 B2 | 3/2005 | Zhang et al. |
| 6,876,570 B2 | 4/2005 | Vincent et al. |
| 6,888,978 B2 | 5/2005 | Zhang et al. |
| 6,920,260 B2 | 7/2005 | Zhang et al. |
| 6,934,424 B2 | 8/2005 | Zhang et al. |
| 6,937,357 B1 | 8/2005 | Vincent et al. |
| 6,940,497 B2 | 9/2005 | Vincent et al. |
| 6,942,312 B2 | 9/2005 | Leung et al. |
| 6,947,205 B2 | 9/2005 | Zhang et al. |
| 2002/0075420 A1 * | 6/2002 | Zhang et al. ................. 349/41 |
| 2002/0075557 A1 * | 6/2002 | Zhang et al. ................ 359/321 |
| 2002/0176276 A1 | 11/2002 | Zhang et al. |
| 2003/0071780 A1 | 4/2003 | Vincent et al. |
| 2003/0194630 A1 | 10/2003 | Beck et al. |
| 2004/0041799 A1 | 3/2004 | Vincent et al. |
| 2004/0080804 A1 | 4/2004 | Vincent et al. |
| 2004/0084661 A1 | 5/2004 | Zhang et al. |
| 2004/0095309 A1 | 5/2004 | Vincent et al. |
| 2004/0122233 A1 | 6/2004 | Beck et al. |
| 2005/0006640 A1 | 1/2005 | Jackson et al. |
| 2005/0040417 A1 | 2/2005 | Li et al. |
| 2005/0052983 A1 | 3/2005 | Vincent et al. |
| 2005/0084204 A1 | 4/2005 | Zhou et al. |
| 2005/0194526 A1 | 9/2005 | Zhou et al. |

OTHER PUBLICATIONS

Maki-Ontto, Rikka, "Flow and Conductivity Porperties of Comb-Shpaed Self-Organized Supramolecules," Dissertation, Helsinki University of Technology, Presented Nov. 23, 2001, 36 pp.

Chambron, Jean-Claude, et al., "Rotaxanes and Other Transition Metal-Assembled Porphyrin Arrays for Long-Range Photoinduced Charge Separation", Coordination Chemistry Reviews, vols. 178-180, 1998, pp. 1299-1312.

Lehn, Jean-Marie, "Supramolecular Chemistry-Scope and Prespectives Molecules-Super moleclues-Molecular Devices", Nobel Lecture, Paris, Dec. 8, 1987.

Aviram, Arieh and Mark A. Ratner, , "Molecular Rectifiers", Chemical Physics Letters, vol. 29, No. 2, Nov. 15, 1974, pp. 277-283.

Lehn, Jean-Marie, Design of Organic Complexing Agents, Strategies Towards Properties, Institut de Chimie, Universite Louis Pasteur, Strasbourg, France, pp. 1-69.

Keuhl, Christopher J., et al., "Self-Assembly of Molecular Prisms via an Organometallic 'Clip'", Organic Letters, vol. 4, No. 6, pp. 913-915.

Seto, Christopher T., et al., "Molecular Self-Assembly Through Hydrogen Bonding: Aggregation of Five Molecules to Form a Discrete Supramolecular Structure", Journal of American Chemical Society, vol. 115, 1993, pp. 1321-1329.

Jeong, Kyu-Sung, et al., "Assembly and Binding Properties of Osmate Ester-Bridged Binuclear Macrocycles", Journal of Organic Chemistry, vol. 64, 1999, pp. 9459-9466.

* cited by examiner

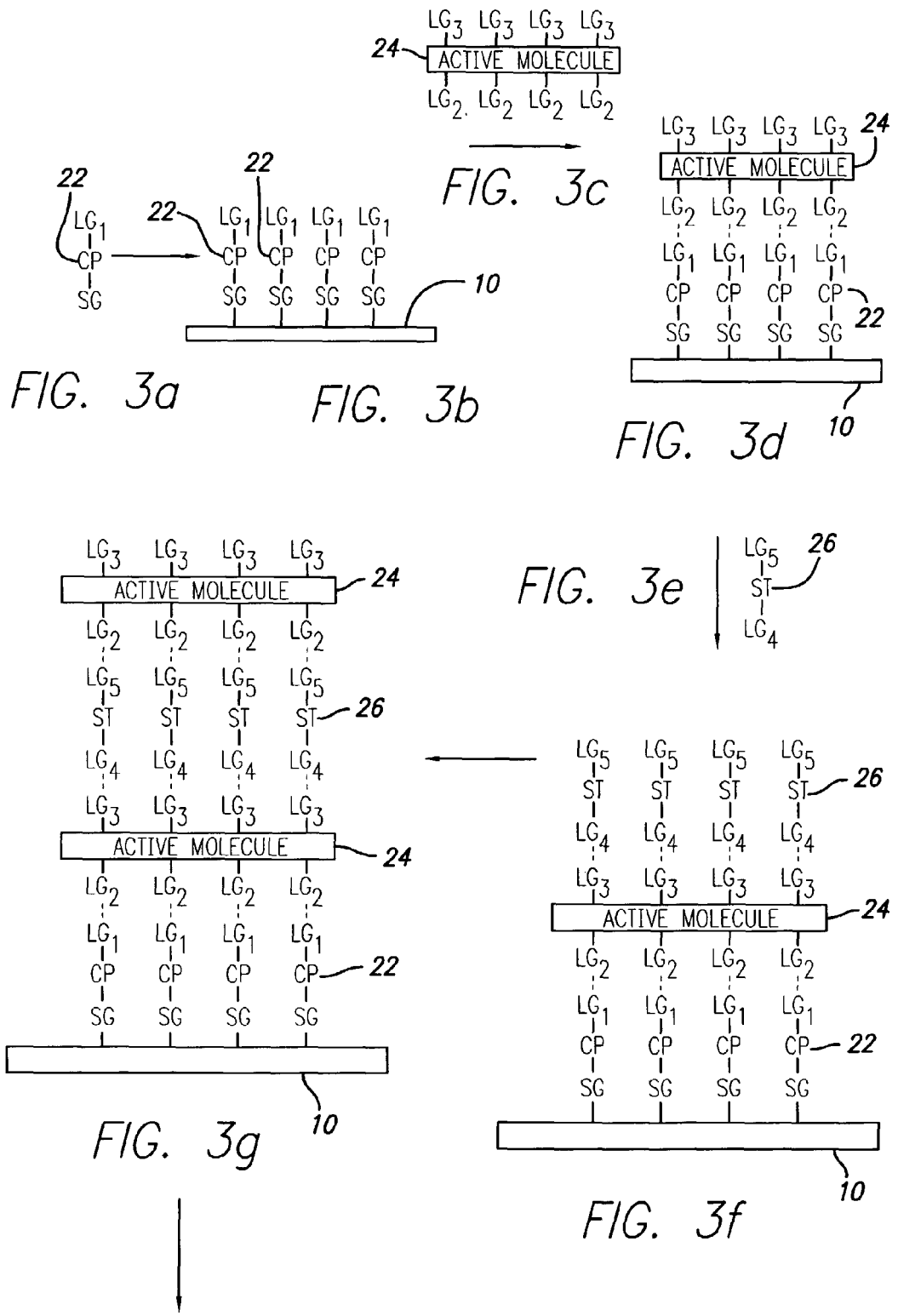

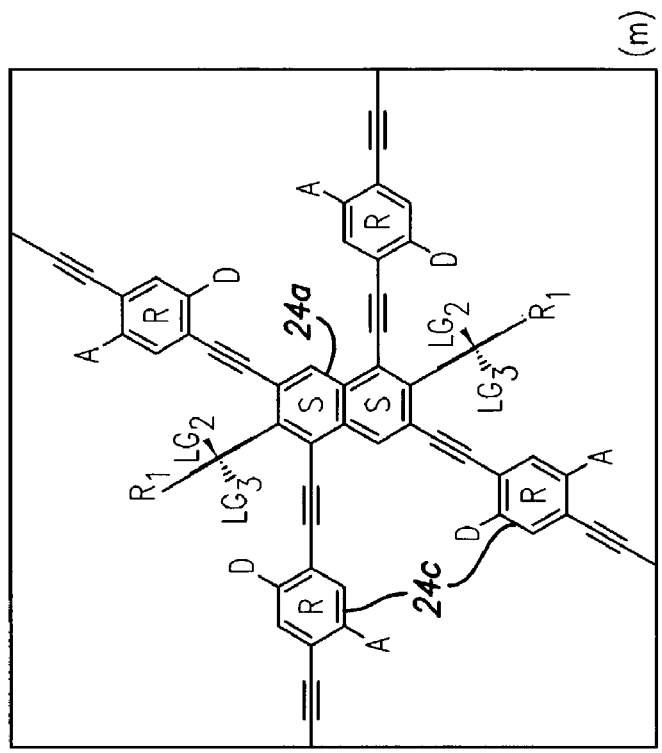
FIG. 4a2
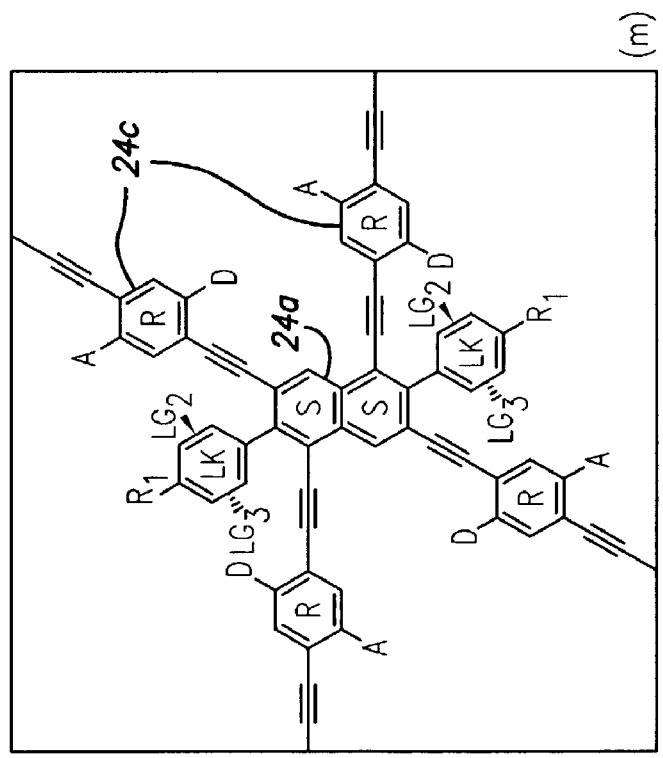
FIG. 4a1

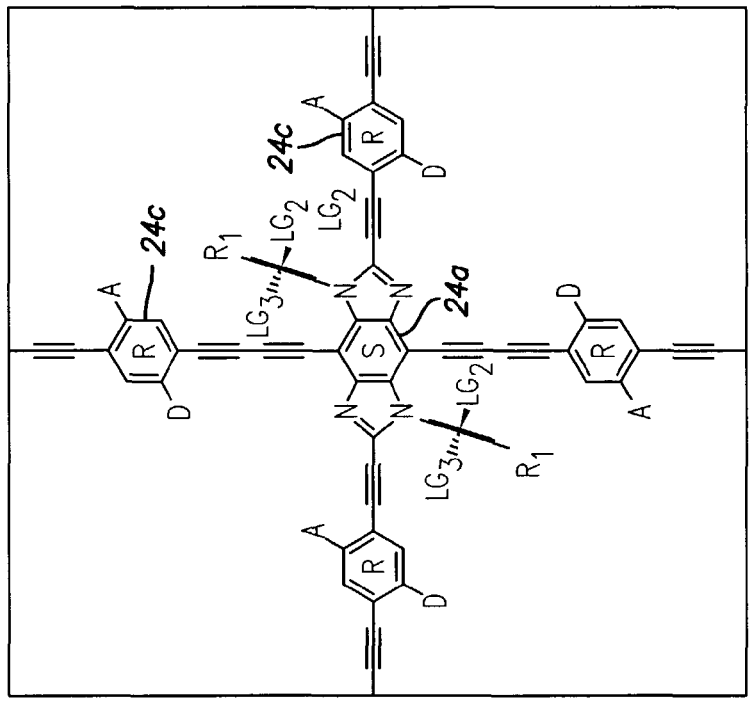
FIG. 4b2
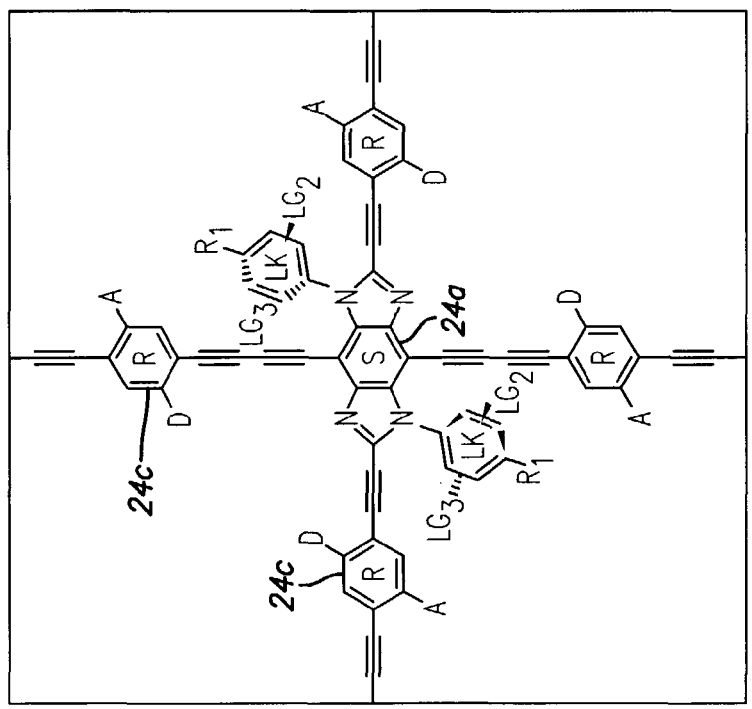
FIG. 4b1

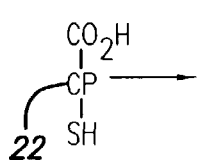
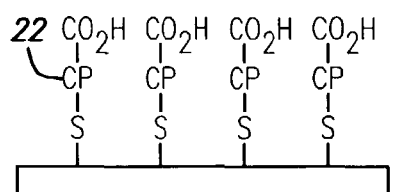
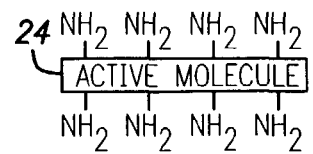
FIG. 5a
FIG. 5b
FIG. 5c
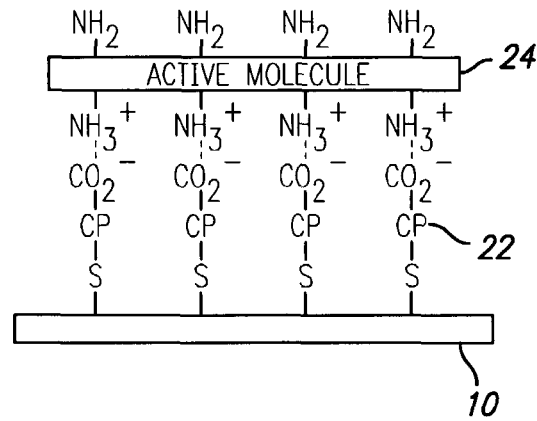
FIG. 5d
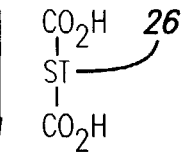
FIG. 5e
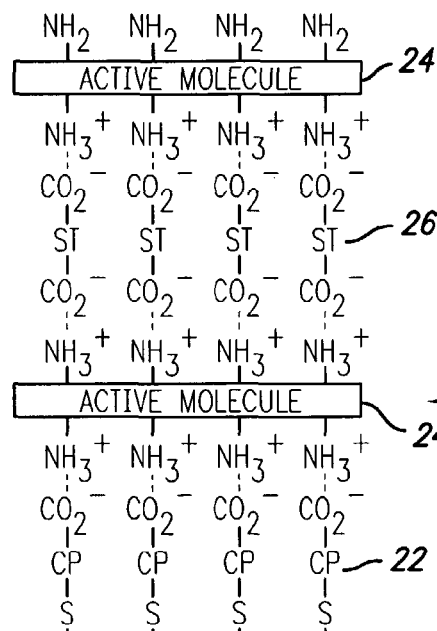
FIG. 5g
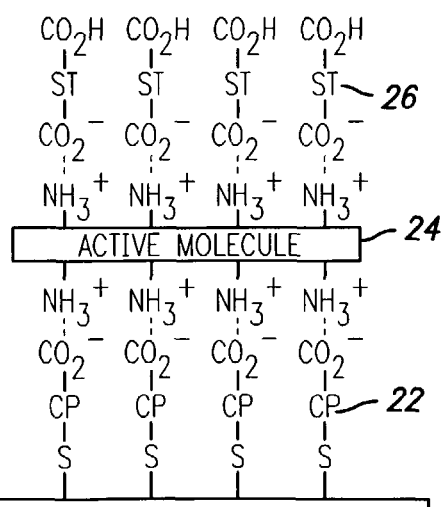
FIG. 5f

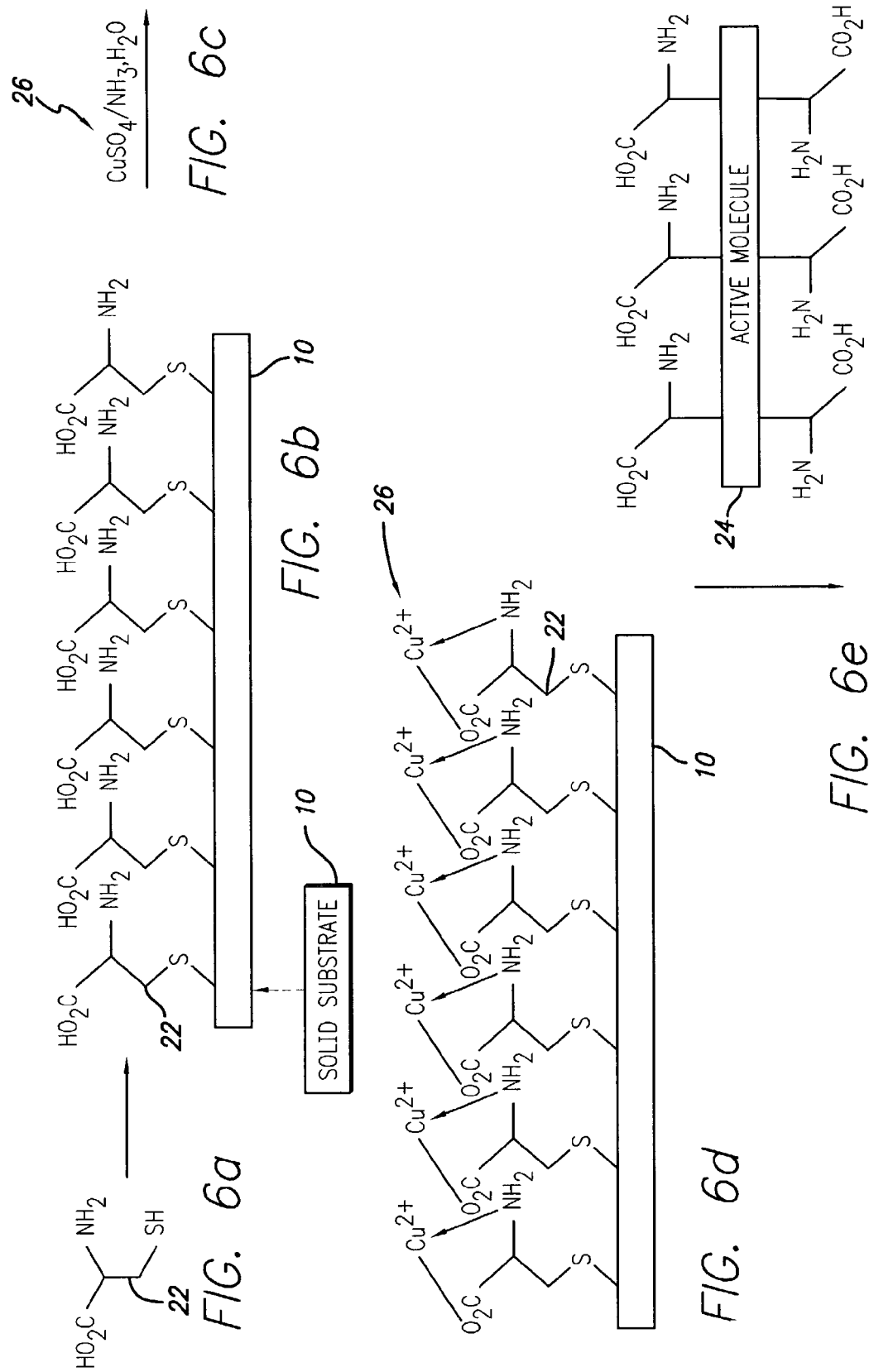

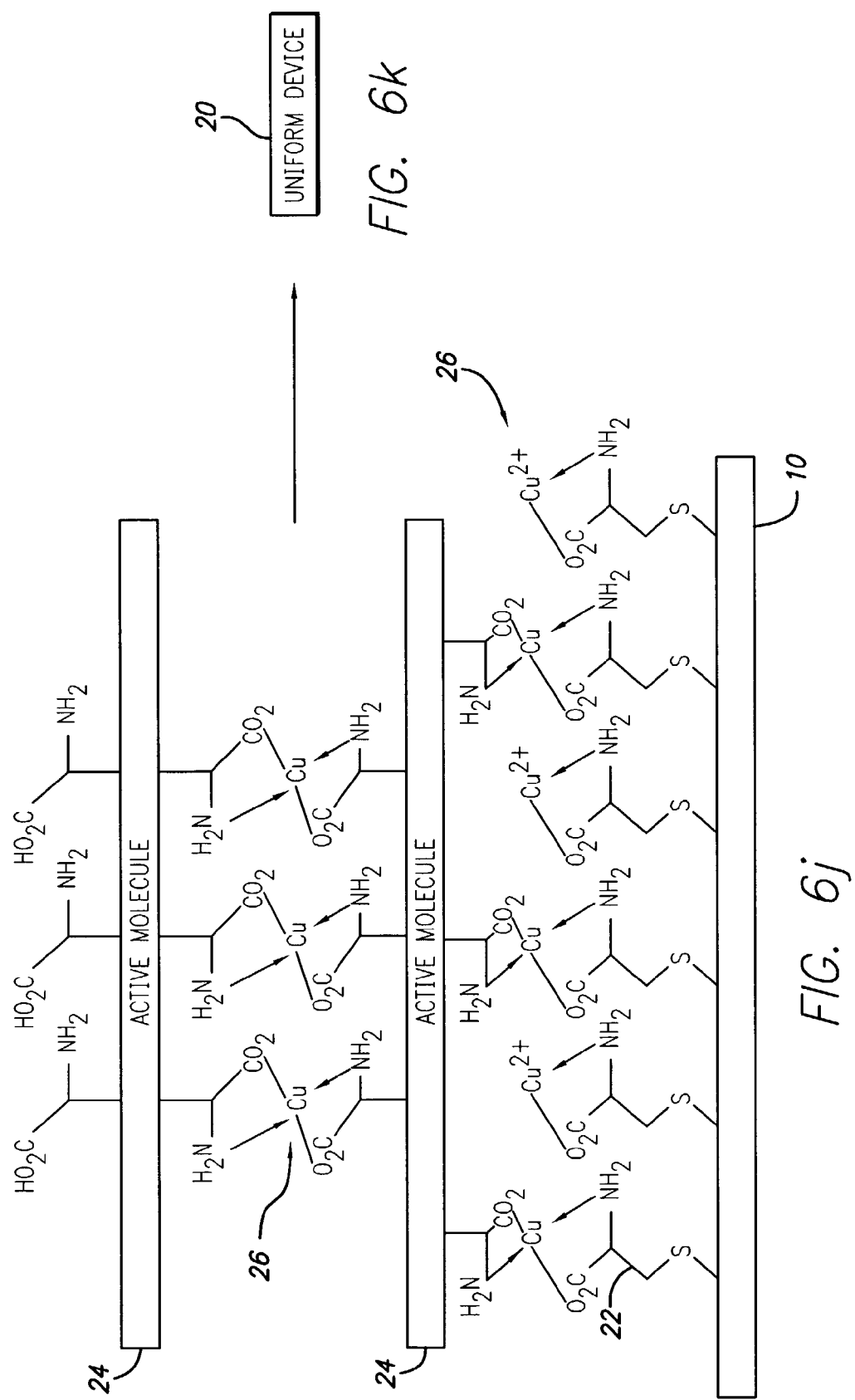

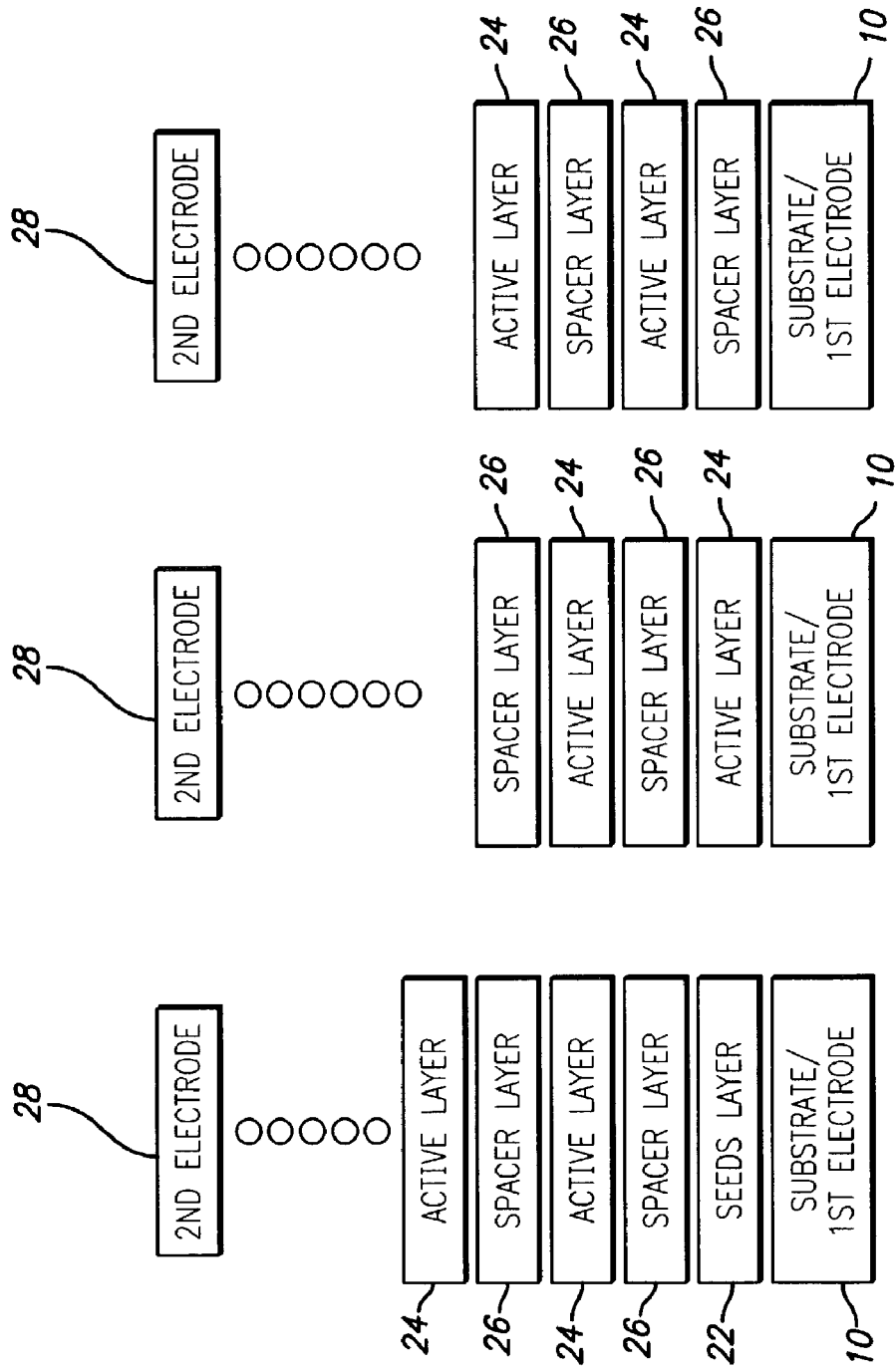

3-D MOLECULAR ASSEMBLY AND ITS APPLICATIONS FOR MOLECULAR DISPLAY AND MOLETRONICS

CROSS-REFERENCE TO RELATED APPLICATIONS

The present application is related to the following applications, which are directed to methods for constructing a one- or two-dimensional (1-D or 2-D) conjugated molecular network through acetylene-acetylene coupling (copending application Ser. No. 10/465,409, filed on Jun. 18, 2003), and how to introduce stacked planes of rotor-stator networks and isomeric rotor-stator pre-assemblies with metal complex or macrocycle spacers bridging spacers in adjacent planes, etc. (copending application Ser. No. 10/465,378, filed on Jun. 18, 2003, now U.S. Pat. No. 6,795,230 issued Sep. 21, 2004). The present teachings introduce an alternative approach for the self-assembly and sequential deposition of multiple layers of molecular materials. In particular, the present teachings are another approach to bringing the rotor-stator type of digital dye from concept to practical application.

The present application is also related to application Ser. No. 10/187,720, entitled "Electric Field Actuated Chromogenic Materials Based on Molecules with a Rotating Middle Segment for Applications in Photonic Switching", and filed on Jul. 1, 2002, in the names of Xiao-An Zhang et al, now U.S. Pat. No. 6,701,035, issued Mar. 2, 2004; application Ser. No. 09/898,799, entitled "Bistable Molecular Mechanical Devices Activated by an Electric Field for Electronic Ink and Other Visual Display Applications", and filed on Jul. 3, 2001, in the names of Xiao-An Zhang et al, now U.S. Pat. No. 6,947,205 issued Sep. 20, 2005; and to U.S. Pat. No. 6,556,470, entitled "Field Addressable Rewritable Media", issued Apr. 29, 2003, to Kent D. Vincent et al, all assigned to the same assignee as the present application, The class of molecules disclosed in the foregoing references has been found to be useful in the optical switching devices of the present application.

The present application is further related to the following applications and patents: Ser. No. 09/846,135, entitled "Bistable Molecular Mechanical Devices with a Middle Rotating Segment Activated by an Electric Field for Electronic Switching, Gating, and Memory Applications", and filed on Apr. 30, 2001, in the names of Xiao-An Zhang et al, now U.S. Pat. No. 6,674,932, issued Jan. 6, 2004; Ser. No. 09/932,186, entitled "Devices Activated by an Electric Field for Electronic Ink and Other Visual Display Applications", and filed on Aug. 17, 2001, in the names of Xiao-An Zhang et al; Ser. No. 09/823,195, entitled "Bistable Molecular Mechanical Devices with a Band Gap Change Activated by an Electric Field for Electronic Switching, Gating, and Memory Applications", and filed on Mar. 29, 2001 in the names of Xiao-An Zhang et al (US Publication 2002-0176276 Nov. 28, 2002); Ser. No. 09/919,394, entitled "Field Addressable Rewritable Media", and filed on Jul. 31, 2001, in the names of Kent D. Vincent et al, now U.S. Pat. No. 6,556,470, issued Apr. 29, 2003; and Ser. No. 09/844,862, entitled "Molecular Mechanical Devices with a Band Gap Change Activated by an Electric Field for Optical Switching Applications", and filed on Apr. 27, 2001, in the names of Xiao-An Zhang et al, now U.S. Pat. No. 6,763,158 issued Jul. 13, 2004, all assigned to the same assignee as the present application. The contents of the foregoing patent applications are incorporated herein by reference.

The present application is still further related to the following applications: Ser. No. 10/016,560, entitled "Hard Copy System Including Rewritable Media", and filed on Oct. 31, 2001, in the names of Kent D. Vincent et al, now U.S. Pat. No. 6,937,357, issued Aug. 30, 2005; Ser. No. 09/978,384, entitled "Port-able Electronic Reading Apparatus", and filed on Oct. 16, 2001, in the names of Kent D. Vincent et al, now U.S. Pat. No. 6,940,497, issued Sep. 6, 2005; Ser. No. 10/051,669, entitled "Scanning, Copying and Printing with Rewritable Media", and filed on Jan. 17, 2002, in the names of Kent D. Vincent et al, now U.S. Pat. No. 6,806,453, issued Oct. 19, 2004; Ser. No. 09/981,166, entitled "High Resolution Display", and filed on Oct. 16, 2001, in the names of Kent D. Vincent et al (US Publication 2003-0071780, Apr. 17, 2003); Ser. No. 10/021,446, entitled "Laser Printing with Rewritable Media", and filed on Oct. 30, 2001, in the names of Kent D. Vincent et al, now U.S. Pat. No. 6,670,981 issued Dec. 30, 2003; and Ser. No. 10/171,060, entitled "Color Display with Molecular Light Valve", and filed on Jun. 13, 2002, in the names of Kent D. Vincent et al, now U.S. Pat. No. 6,853,478 issued Feb. 8, 2005, all assigned to the same assignee as the present application. The contents of the foregoing patent applications are incorporated herein by reference.

TECHNICAL FIELD

The present invention is to color switches, and, more particularly, to the fabrication of color switches based on molecules including rotor and stator components as part of their structure.

BACKGROUND ART

Switching molecules capable of changing color from one state to another under the influence of an electric field are the subject of ongoing investigation. In general, the color change occurs through a molecular conformation change that alters the degree of electron conjugation across the molecule and, thereby, its molecular orbital-induced HOMO-LUMO (highest occupied molecular orbital-lowest unoccupied molecular orbital) states. In a main embodiment, the conformation change occurs through field rotation of a ring or rings within the molecule. In this instance, the conjugation is broken between the rotating rings, called rotors, and ring structures that do not rotate, called stators. The rotors have electric dipoles that induce rotation within a given field. A coupling group (e.g., acetylene) between the rotor and stator elements serves as a "bearing" and conjugation bridge between the rotor and stator.

The novel molecular color switch promises a unique set of dye-like optical properties that make it ideal for applications such as electronic paper, paper-like displays, electronic books, projection displays and the like.

The concept of electronic devices based on active molecular components was proposed almost thirty years ago. Since then, hundreds of publications and numerous proposals have appeared. So far, one of the most promising architectures that will lead to highly effective and durable molecular devices is the rotor-stator configuration disclosed and claimed in above-referenced Ser. No. 10/187,720 (U.S. Pat. No. 6,701,035); Ser. No. 09/898,799 (U.S. Pat. No. 6,947,205); and U.S. Pat. No. 6,556,470.

The rotor-stator configuration of the these patent applications and patent turns ink or dye molecules into active optical-electronic devices that can be switched with an external electric field for electronic ink and other visual display applications. This type of molecule is neither oxidized nor reduced in switching from one state to the other. Furthermore, the molecule exhibits image contrast and mechanical durability commensurate with ink on paper. Although not specifically called "digital dyes" therein, that phrase is becoming associated with such ink or dye molecules.

A major challenge in the development of the molecular color switch is the need for self-assembled colorant layers on the order of 0.05 to 1.0 micrometer in thickness. Each switch molecule in the colorant layer used in print or display media must be correctly oriented with respect to the switching field and be spaced sufficiently from other molecules to allow unhindered rotation of the switching rotors. Such spacing and alignment must be repeated over a colorant thickness sufficient to achieve the optical density typical of commercial print (nominally 0.5 to 1.0 micrometer). A related challenge is to design the colorant layer for cost-effective switching voltages and addressing; Yet another challenge is to design a colorant layer that switches from a highly conjugated black to transparent state under such low switching voltages. A still further challenge is to design a means to constrain the stator sections of the molecular switch to prevent rotation with rotor rotation. The lowest conformational energy state of the typical molecular switch provides for planar rotors and stators. Un-constrained, the rotor and stator will naturally want to rotate together, vitiating any desired color change. Yet another challenge is to design a colorant layer that provides high optical density with minimized switching voltage. Still further, there is the challenge of providing a means for creating specific subtractive colors, such as cyan, magenta and yellow meeting the above rotor orientation and switching voltage needs. Further yet, there is the challenge of providing a means for bi-stable color switching enabling the colored and transparent states to remain stable indefinitely in the absence of a field. Bi-stable operation enables such applications as electronic paper and electronic books. It also provides the lowest energy alternative for display related applications since no holding voltage is required to maintain a pixel and only pixels needing to change are switched.

Additional requirements include the following: the active dye molecules in this system have to be oriented in such a way that all their rotors' dipoles should be easily aligned with the direction of the applied external electrical field (E-field). Preferably, the dipoles should be orthogonal to the field. The rotor portions of the system should be easily switched ON (in the plane) and OFF (out of the plane) with respect to the conjugated molecular system (stator portions of the system) by an external E-field. The molecular thin film between the electrodes has to be assembled in such a way that only the stator portions of the molecules will be linked together to form a 3-D network system without encroaching on the region surrounding the rotors.

To date, even though many methodologies have been developed for thin film preparation, such as Langmuir-Blodgett (L-B) technique, the Self Assembled Monolayer (SAM) method, Vapor Deposition (VD) and spin coating, etc., none of them can meet the above-discussed requirements at the same time.

For example, the L-B technique is very useful for preparing high quality thin films. Both monolayer and multi-layers thin film can be prepared using this method. However, L-B technique is only suitable for certain molecules, and these molecules must have a good hydrophilic end-group and one hydrophobic end-group connected by long alkyl chain in the middle in order to form a high quality thin film. This very strict requirement limits one greatly in terms of designing active device molecules. Furthermore, multi-layers prepared by L-B method usually have the pattern of head-head (H-H) and tail-tail (T-T) orientation, as shown in FIG. 1, which depicts a substrate 10 supporting a plurality of molecules 12 in H-H, T-T configuration, to provide a multi-layer structure 14, here, six layers 16. This particular characteristic limits one even further in terms of device preparation; one cannot make a uniform thin film with all molecules aligned in the same direction using the L-B technique.

The SAM method is another very popular way by which thin films are made. It is simple, easy and less restrictive to operate than the LB process. However, it has been used only in monolayer preparation so far, and until now, nothing has been found in literature that shows how to make multi-layer thin film.

Spin coating is another useful method for thin film preparation, and has found use in both academic research and industrial applications. This technique can be used for various thin films preparation. Adjusting both the viscosity of the coating solution and the spin speed allows one to easily control thickness of the thin film. However, this method cannot control the molecular orientation during the film preparation. It will always produce a thin film with molecules oriented randomly in all directions. Even though some researchers have attempted to use a combination of an external E-field and spin coating, the results have not been promising.

Vapor deposition techniques have been gaining popularity in recent years. Such techniques have proved to be a very useful technique in semi-conductor and other related industries. It is very good for use with materials with a low boiling point or materials with good thermal stability even at temperatures above its boiling point. Vapor deposition is usually used in metal or metal oxide deposition for obvious reasons. However, it does not work well when the materials are less thermally stable, especially at relatively high melting or boiling points. Since most large, rigid organic molecules are less thermally stable, they may undergo chemical decomposition at elevated temperatures far below their melting or boiling points. In fact, the active molecules used in the above-described color switches, such as large rigid and highly conjugated organic molecular networks, usually decompose prior to reaching their melting point (typically >200° C.).

Organized self-assembly is another possible approach, which forms the basis of the present disclosure and claims. This concept was first proposed 30 years ago. Many research groups worldwide have been working in this area since then. All work in this area so far can be classified into the following categories: (1) self-organizing polymers to achieve certain material properties; (2) self-assembling the 2-D or 3-D supra-molecular constructs via metal coordination; and (3) material assembly via hydrogen bonding or other type of intermolecular interactions.

Until now, scientists have been able to carry out organized assembly in solution, and letting those custom-designed molecules self-assemble freely in a certain organized way to form various particles (micron or sub-micron range) in solution. Undoubtedly, self-assembled materials prepared by these methods are highly organized within each individual particle. But as a whole, they are not uniform, and they are not much more than a random mixture of aggregated particles. Such self-assembly of a supra-molecular thick solid film is difficult, and the present application provides a simpler, more controllable alternate means.

Recently, an elegant way to self-assemble molecular prisms via an organometallic "clip" has been demonstrated. Combination of two tritopic pyridyl ligands with three platinum atoms containing the molecular "clip" spontaneously generates supra-molecular coordination cages with trigonal prismatic frameworks under some appropriate conditions. Several other research groups have also demonstrated similar self-assembly via metal coordination by using different noble metals, such as Ni, Os, Pd, Eu, etc.

There are several serious problems that are limiting these technologies being developed for industrial applications. One major problem is cost. The chemistry developed based on metal coordination so far relies heavily on very expensive noble metal reagents. Another problem is the stability of the reagents, most of which are air-sensitive. Extra precautions must be taken to prevent these reagents from coming into contact with oxygen, making it even less practical in large-scale manufacturing. Carrying out the assembly on a solid substrate and controlling the exact molecular orientation is apparently considered to be difficult, in that there appears to be no published information on this.

Using intermolecular hydrogen bonding is another very popular way for organized assembly. One way of molecular self-assembly through hydrogen bonding has been demonstrated. In particular, the aggregation of five molecules to form a discrete supramolecular structure by using substituted triazine and its derivatives as linking groups has been shown. However, this work is still limited in assembling soluble molecular clusters with small molecules in solution. The method cannot be used for assembly on a solid substrate, and the molecular orientation cannot be controlled by this method either.

Thus, a need remains for a technique that overcomes the above-discussed problems and permits assembling molecules of controlled orientation on solid substrates.

DISCLOSURE OF INVENTION

In accordance with the embodiments disclosed herein, a three-dimensional molecular assembly, formed on a substrate, is provided. The molecular assembly comprises:

a first monolayer of seed molecules for initiating self-assembled molecular growth, the first monolayer formed on the substrate;

a second monolayer of active molecules comprising a plurality of rotor and stator moieties, with one rotor moiety supported between two stator moieties, the second monolayer of active molecules formed on the first monolayer of seed molecules, with a one-to-one correspondence between molecules in the first monolayer and the second monolayer;

a third monolayer of spacer molecules, formed on the second monolayer of active molecules, with a one-to-one correspondence between molecules in the second monolayer and the third monolayer; and a plurality of alternating second monolayers and third monolayers having the one-to-one correspondence.

Further in accordance with the embodiments disclosed herein, a method is provided for fabricating the three-dimensional molecular assembly. The method comprises:

forming on the substrate a first monolayer of seed molecules for initiating self-assembled molecular growth;

forming on the first monolayer a second monolayer of active molecules comprising a plurality of rotor and stator moieties, with one rotor moiety supported between two stator moieties, with a one-to-one correspondence between molecules in the first monolayer and the second monolayer;

forming on the second monolayer a third monolayer of spacer molecules, with a one-to-one correspondence between molecules in the second monolayer and the third monolayer; and forming a plurality of alternating second monolayers and third monolayers having the one-to-one correspondence.

BRIEF DESCRIPTION OF THE DRAWINGS

FIGS. 3a-3i are a generic schematic representation of one embodiment depicting the fabrication of a 3-D molecular assembly of active molecules on a solid substrate;

FIGS. 4a-4c each illustrate a specific example of how the connector units are attached to the stator portion of the active molecule;

FIGS. 5a-5i are a schematic drawing depicting another embodiment, using specific molecules with specific connecting groups to fabricate the 3-D molecular assembly of active molecules on a solid substrate;

FIGS. 6a-6k are a schematic drawing similar to FIGS. 5a-5i and depicting still another embodiment, using a different set of molecules and connecting groups; and FIGS. 7a-7c depict alternate molecular multi-layer structures.

BEST MODES FOR CARRYING OUT THE INVENTION

Reference is made now in detail to specific embodiments, which illustrates the best mode presently contemplated by the inventors for practicing the invention. Alternative embodiments are also briefly described as applicable.

The teachings herein pertain to an approach for spacing sequentially-deposited layers of molecular materials. This enables the assembly of active molecules for a three-dimensional (3-D) device in a precise, organized and controllable manner.

The present teachings provide a simple and effective means to assemble active molecules in a three-dimensional device in an exact, organized and controllable way and enable control of the film thickness and molecular orientation precisely during the organized assembling. It is a simple, easy, very tolerable, and low cost process, and can be readily scaled up for industrial application.

It should be noted that this unique, controllable, organized three-dimensional molecular assembly method could be used in many areas other than molecular electronics, including, but not limited to, information storage and display.

The Basic Components and Structure

Figure 2:
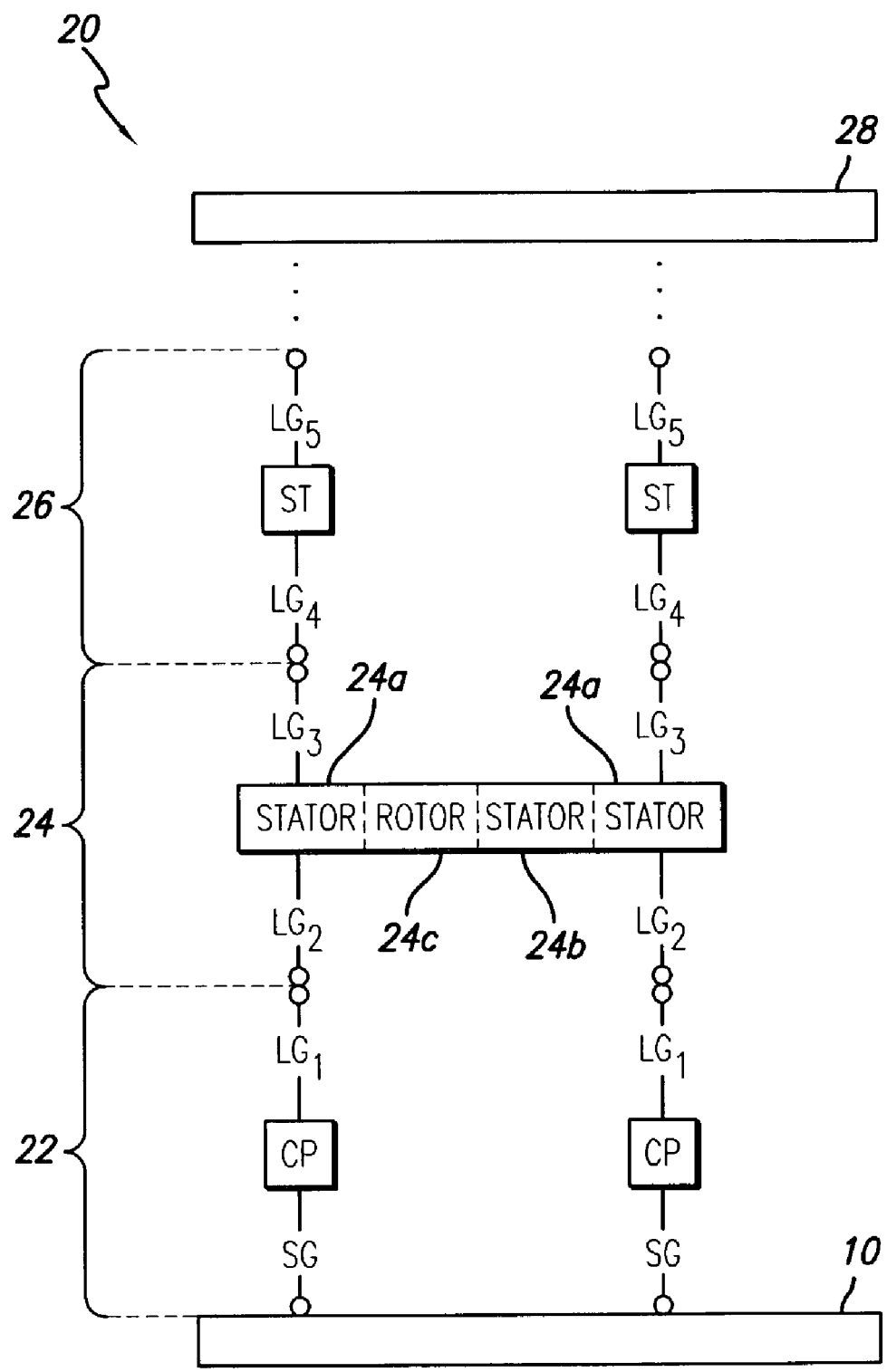
FIG. 2 is a schematic representation of one embodiment depicting the basic components in a 3-D molecular structure, based on the teachings herein.

The present teachings involve only three basic processing steps. The basic concept is to start with "seed" molecules to initiate an organized molecular assembly 20 as shown in FIG. 2.

The first step is to lay down a Self-Assembled Monolayer (SAM) of "seed" molecules 22 on top of a solid substrate 10. The function of the "seed" molecules 22 is to anchor, or adhere, the molecules onto the solid substrate 10 and to control the molecular orientation with respect to the substrate. This step determines the molecular orientation and orderliness of the subsequent depositions.

Next, a monolayer 24 of "active molecules", which is discussed in greater detail below, self-assembles on top of the "seed" monolayer 22.

The final step involves a so-called "spacer" layer, or molecular column, 26 to be deposited on top of the active molecules layer.

The last two basic steps could be repeated as many times as necessary so that a molecular thin film structure of the desired thickness can be built up, layer by layer, in a simple and well-controlled manner.

The seed molecules 22 for this type of controllable molecular assembly are some type of specially-designed asymmetric bi-functional molecules. At least one of the functional groups has to be capable of self-assembly onto the designated solid substrate. The other functional group in the seeds should not interfere with or be capable of self-assembly, but it should be able to form some kind of selective connection with specially-designed color switching molecules, or active molecules, 24.

Since the primary focus of the end use is related to digital dyes and displays, the terms "color switching molecules" and "active molecules" are used interchangeably herein. More often than not, the term "active molecules" will be used. Moreover, it should be noted that the process described herein is not restricted only to color switching molecules. Other types of molecules for other non-optical or non-display applications, such as information storage, surface treatment or coating, etc., may be used instead.

The active molecules 24 are designed in such a way that they have at least one connector unit attached directly onto certain stator portions 24a of the molecule. In fact, the connector unit(s) belong(s) to part of the stator. Each connector in turn must have two or more functional groups, each pointing in different, preferably opposite, directions. All the functional groups in the connector can be identical or different. If they are different, one of the groups must have a much stronger affinity (than the other functional groups) to self-assemble with the seeds 22 already bonded to the substrate 10. This preferential connecting ability ensures that all the active molecules line up in the same way. On the other hand, in the case of the functional groups in a connector being identical, only one of them will connect with the seeds 22 due to steric effects. In general, the bonding between the functional groups that are connected together can be either physical or chemical.

Not all stators 24b in the active molecules 24 necessarily have a connector unit attached to them, as shown schematically in FIG. 2. When the connectors are not fully populated, the connectors can be attached onto the stators close to the edge of the molecules, or away from the edge, depending on the application. Currently, in use in digital dyes, it is preferred that the connector unit be away from the edge of the molecules, so that the active molecules 24 are lying down instead of standing up. For other applications, the connector unit can attach directly on the edge of the molecules, so that the molecules preferentially stand up. Furthermore, in digital dye applications, the connector units should not have a significant impact on the overall chromophore or electronic properties of the active molecules.

A third component, the spacer 26, joins two adjacent layers of active molecules 24 together in a very precise way through two separate self-assembly processes. Chemically, the spacer 26 comprises some special-purpose molecules, ions or atoms that serve as a molecular "glue". The challenge here, however, is to assemble them layer-by-layer without creating inter-molecular interference, especially not to hinder the rotational movement of rotor 24c in the active molecules 24. Another equally demanding challenge is that the layering structure must provide just enough, but not too much, room for the rotors 24c to rotate. The reason that it is desired to minimize the interlayer spacing is that the digital dye should operate with the least power consumption.

The three-step controllable organized assembling process permits control of the molecular orientation and the thin film thickness precisely, and this enables the fabrication of a working device with the active molecules 24. The process uses a simple dipping or immersing method, involving no expensive or high-precision equipment. The entire process can be easily scaled up to industrial process, such as roll-to-roll for large-scale industrial production.

It will be noted that the active molecules 24 employed herein are generally custom-designed with certain desired characteristics, be it storage or display, whereas the spacers 26 and seeds 22 are generally off-the-shelf compounds or sometimes custom-designed. The active molecules 24 are so engineered that they form certain connections, preferably via ionic bonds or metal chelation, with certain functional groups in the spacers 26 or seeds 22. As a requirement, the active molecules 24, spacers 26, and seeds 22 in this organized assembly must be soluble in certain appropriate solvents or mixed-solvents so that the process of self-assembly can take place. However, once self-assembled onto their counterparts, such molecules will not back-dissolve in the reagent solutions during the subsequent processing steps. This will ensure the production of a high quality 3-D thin film 20 by this controllable, organized assembly method.

The substrate 10 serves as one electrode. To fabricate a device 20, a second electrode 28 is formed on, or otherwise attached to, the upper-most layer of the structure.

DETAILED AND SPECIFIC EXAMPLES

FIGS. 3a-3i are generic schematic figures depicting how the process works, while FIGS. 4a-4c, 5a-5i, and 6a-6k are specific examples. It is worth noting that all of the specific examples described below use ionic or metal chelating connection as the preferred methods to interlock the molecules between the two adjacent layers. However, other connecting means are possible, even though they are not explicitly given here. All the examples are only illustrative of the preferred embodiment, which achieves the objects, features and advantages of present teachings, and it is not intended that the appended claims be limited thereto.

The following legends and explanatory notes apply to FIGS. 3a-3i:

The seed molecules 22 (FIG. 3a) comprise three parts: SG, LG, and CP. They are used for initialization of the organized assembly on the solid substrate. SG represents a functional group, which is capable of self-assembly onto the selected solid substrate, or first electrode, 10. SG can be, but is not limited to, one of the following: SH, S-acyl, S—S-alkyl, OH, $NH_2$, NH-alkyl, NH-aryl, NH-acyl, heterocyclic systems (e.g., pyridine and its derivatives, etc), and carboxylic acid and its derivatives.

$LG_1$ is an abbreviation for a connectable functional end-group. This functional group should not interfere or compete with SG during the first self-assembling step. On the contrary, $LG_1$ should form certain connections with the connecting groups of the custom designed color switching molecules, or active molecules, 24. $LG_1$ can be, but is not limited to, any one of the following: SH, OH, $NH_2$, NH-alkyl, NH-aryl, NH-acyl, unsaturated hydrocarbon or substituted hydrocarbon, heterocyclic system, carboxylic acid and its derivatives, sulfuric acid and its derivatives, and phosphoric acid and its derivatives.

CP represents an interconnecting portion of the seed molecule 22 that interconnects both the SG and $LG_1$ together. CP can be, but not limited to, one of the following: a single σ-bond, a single atom (such as =N—, —O—, —S—), or an atomic group (e.g., —NH—, —N(alkyl)-, —N(aryl)-, —N(acyl)-, —CH=N—, C(alkyl)=N—, —C(aryl)=N—, acetylene, ethylene or substituted ethylene, hydrocarbons (either saturated or unsaturated) or substituted hydrocarbons, heterocyclic systems, and carboxylic acid and its derivatives.

The active molecules 24 are shown in FIG. 3c and are made up of the main body of the active molecule along with one or more connector units. In fact, the connector unit(s) belong(s) to a part of the main body of the active molecule 24. Each connector has two connecting groups ($LG_2$ and $LG_3$), which point in different directions, preferably in opposite directions. $LG_2$ and $LG_3$ can be identical or different. In the case they are different, one of the groups must be able connect with the seed ($LG_1$) preferentially over the other connecting group ($LG_3$). If they are identical ($LG_2=LG_3$), only one of the functional groups can form some kind of connection with the connecting group $LG_1$ in the seed due to steric effects. During a layer-by-layer stepwise assembling, only one functional group in each connector will form a specific kind of bonding (either a physical or chemical connection) selectively with the two neighboring layers each time. Furthermore, in digital dye applications, this type of connector should only function for connecting purposes, and should not significantly impact the overall chromophore of the active molecules. The connector unit can be attached onto all or some stator portions of the active molecules. If not all stators have connecting groups associated with them, it is preferred that the connecting groups be located away from the edge of the molecules, so that the active molecules 24 will preferentially lie down instead of stand up, as in the case of digital dye applications. For other applications, the connector unit can attach directly on the edge of the molecules so that the molecules will preferentially stand up during the assembly.

The active molecules 24 are self-assembled to the seed molecules 22, such as by dipping the substrate 10 with seed molecules 22 thereon into a diluted active molecular solution, as shown in FIG. 3d. The $LG_2$ portions of the active molecule 24 connect with the $LG_1$ portions of the seed molecules 22 on a 1:1 basis.

The spacer molecules 26 are shown in FIG. 3e and comprise three components: ST, $LG_4$ and $LG_5$. The $LG_4$ moieties of the spacer molecules 26 react with $LG_3$ of the active molecule 24 to form the next layer on the molecular assembly. Both $LG_4$ and $LG_5$ are connectable end-groups interconnected by ST. The $LG_4$ and $LG_5$ point in different directions, again preferably in opposite directions. ST here represents the interconnecting portion of the spacer molecule 26, which links both $LG_4$ and $LG_5$ together. The spacer molecule 26 is used as a molecular "glue", joining one monolayer of molecules with an adjacent monolayer layer. Just like the active molecules 24, $LG_4$ and $LG_5$ can be identical or different. In the situation that they are different, one of the groups ($LG_4$) must be able connect with the active molecules' functional group $LG_3$. If they are identical ($LG_4=LG_5$), only one of the functional groups can form some kind of connection with the active molecules due to steric effects. During a layer-by-layer stepwise assembling, only one functional group in each connector will form a specific kind of bonding (either a physical or chemical linkage) selectively with the two neighboring layers each time. Furthermore, in the digital dye applications, the spacer 26 should only function for spacing and separating purposes, and should not significantly impact the overall device functionality or characteristics.

$LG_2$, $LG_3$ $LG_4$ and $LG_5$ can be, but not limited to, any one of the following: SH, S-acyl, S—S-alkyl, OH, $NH_2$, NH-alkyl, NH-aryl, NH-acyl, heterocyclic systems (e.g., pyridine and its derivatives, etc), carboxylic acid and its derivatives, sulfuric acid and its derivatives, phosphoric acid and its derivatives.

ST can be, but not limited to, one of the following: a single σ-bond, a single atom (such as =N—, —O—, —S—) or an atomic group (e.g., —NH—, —N(alkyl)-, —N(aryl)-, —N(acyl)—CH=N—, —C(alkyl)=N—, —C(aryl)=N—, acetylene, ethylene or substituted ethylene, hydrocarbons (either saturated or unsaturated) or substituted hydrocarbons, heterocyclic systems, and carboxylic acid and its derivatives.

Figures 3H, 3I:
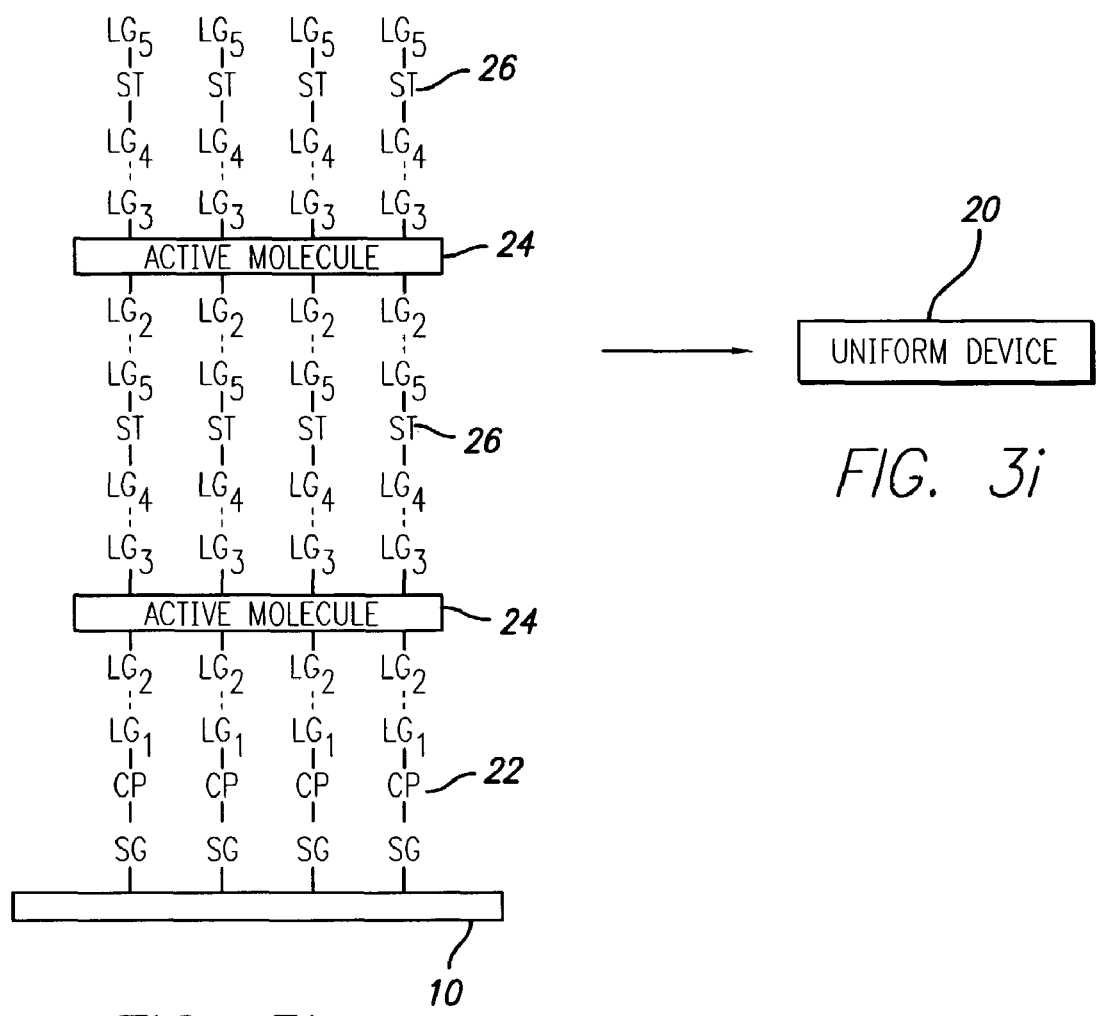

The foregoing process is repeated for assembling alternating layers of active molecules 24 and spacer layers 26, as shown in FIGS. 3g-3h. A second electrode 28 (not shown) is then formed on the uppermost layer (as shown in FIG. 2) to form the completed device 20, depicted in FIG. 3i.

It should be noted that the connector units of the active molecule 24 are designed in such a way that they are not in a coplanar conformation with the main body of the active molecule. Preferably, they are orthogonal to the main body of the active molecule 24.

Device Fabrication

Step 1:

The seed molecules 22, depicted in FIG. 3a, are first chemically bonded onto the top surface of the bottom electrode 10 via the SAM method. The bottom electrode 10 and associated layer 22 are then rinsed thoroughly with an appropriate solvent or solvent mixture to remove any excess reagent. It is expected that one skilled in the art can readily determine the appropriate solvent or solvent mixture to use in the fabrication of the devices described herein.

Step 2:

The resulting coated substrate 10, shown in FIG. 3b, is then immersed in a diluted solution of the active molecules 24, shown in FIG. 3c. The acid-base reaction between the seeds 22 and the active molecules' end-groups occurs. The acid-base ionic interaction being exothermic, the active molecules 24 self-organize, thereby achieving the most stable and lowest energy state possible. As a consequence, a dense and highly uniform layer (without obvious domain walls) of the active-molecule thin film, shown in FIG. 3d, with the desired molecular orientation forms as the second step of the organized self-assembly method. The bottom electrode 10 and associated layers 22, 24 are then rinsed thoroughly with an appropriate solvent or solvent mixture to remove any excess reagent.

Step 3:

The spacers 26 are then introduced next by dipping the sample of FIG. 3d into another diluted solution containing the spacers depicted in FIG. 3e. The acid-base or metal chelating reaction takes place between the functional group $LG_3$ of the active molecule and the functional group $LG_4$ of the spacers 26, resulting in another reactive monolayer, shown in FIG. 3f. The bottom electrode 10 and associated layers 22, 24, 26 are then rinsed thoroughly with an appropriate solvent or solvent mixture to remove any excess reagent.

Step 4:

Next, a second layer of active molecules 24 is laid down on the top of reactive spacers monolayer 26 by immersing the resulting intermediate device, shown in FIG. 3f, into a diluted solution of the active molecules 24. The acid-base ionic reaction or metal chelating interaction occurs between the functional groups $LG_5$ of the spacers 26 and $LG_2$ of the active molecules 24. Since the acid-base or metal chelating interaction is exothermic, the active molecules 24 self-organize on top of the spacers monolayer 26 to achieve the most stable and lowest energy state possible, forming a dense and highly uniform second layer of the active-molecule thin film, shown in FIG. 3g, with the desired molecular orientation. The bottom electrode 10 and associated layers 22, 24, 26, 24 are then rinsed thoroughly with an appropriate solvent or solvent mixture to remove any excess reagent.

Next, a second layer of spacer molecules 26 is laid down on the top of the reactive active molecules monolayer 24 by immersing the resulting intermediate device, shown in FIG. 3g, into a diluted solution of the spacer molecules 26. Again, the exothermic reaction occurs, and the spacer molecules 26 self-organize on top of the active molecules 24 to form a dense and highly uniform second layer of the spacer thin film, shown in FIG. 3h, with the desired molecular orientation. The bottom electrode 10 and associated layers 22, 24, 26, 24, 26 are then rinsed thoroughly with an appropriate solvent or solvent mixture to remove any excess reagent.

By repeating steps 2 and 3 alternatively multiple times and forming the second electrode 28 (not shown) on the uppermost layer, a highly uniform multi-layer molecular thin film device 20 (FIG. 3i) with the desired molecular orientation is formed by this controllable, organized molecular assembly method.

Figure 4C:
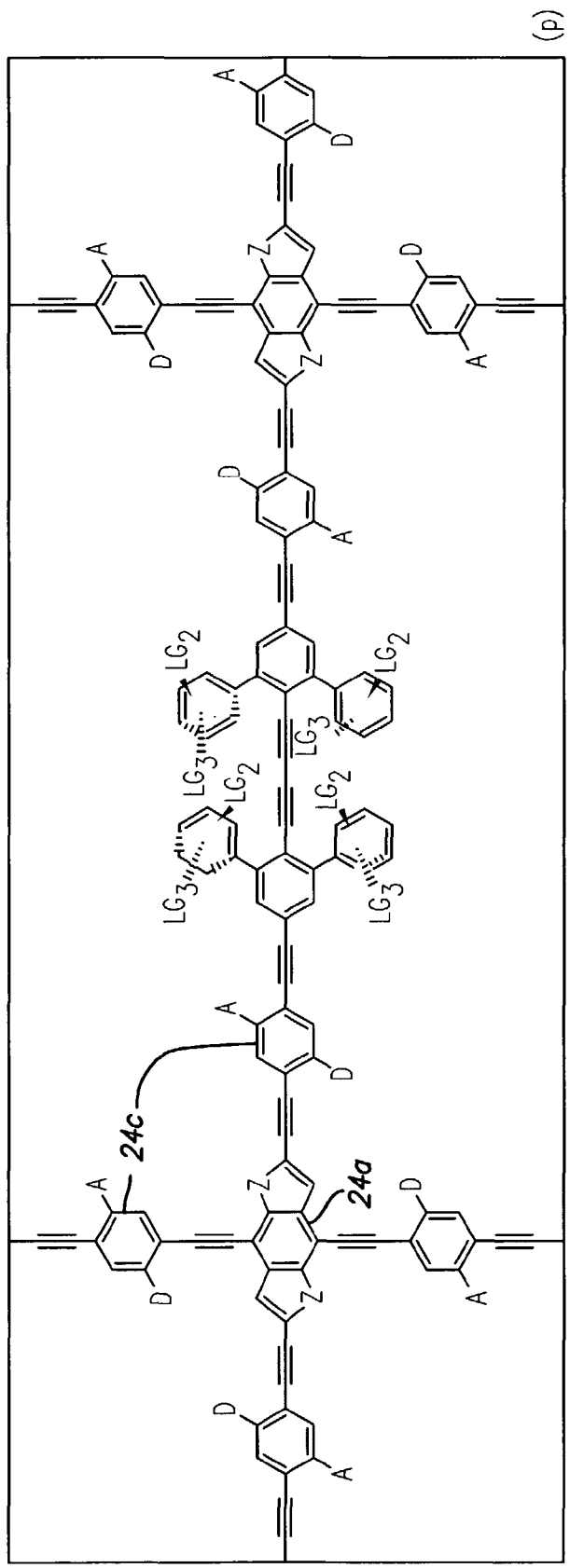

FIGS. 4a-4c depict three examples of how the connector unit is attached to the stator portion 24a of the active molecule 24. However, it is only illustrative of the preferred embodiment, which achieves the objects, features and advantages of present teachings, and it is not intended that the appended claims be limited thereto.

Referring to FIGS. 4a-4c:

S refers to the stator portion 24a of the active molecule 24;

R refers to the rotor portion 24c of the active molecule;

LK represents an interconnecting unit of the active molecule;

A represents an electron-accepting group;

D represents an electron-donating group;

$R_1$ represents a single atom such as hydrogen or halogen atom or an atomic group such as SH, S-acyl, S—S-alkyl, OH, $NH_2$, NH-alkyl, NH-aryl, NH-acyl, heterocyclic systems (e.g., pyridine and its derivatives, etc), carboxylic acid and its derivatives, hydrocarbon (either saturated or unsaturated) and substituted hydrocarbon; and $LG_2$ and $LG_3$ are two connecting groups of the connector unit pointing in different directions, linked together by LK.

It is worth noting that the connector unit can be attached onto the stator portion 24a either directly or indirectly, depending on the application, though it is preferred that the connector unit be connected directly via a single bond for the preferred digital dye applications. From FIGS. 4a, 4b, and 4c, the connector units (here, a substituted benzene ring) are attached directly to the stator portion 24a of the molecule via single σ-bonds, One connector unit is attached directly to the carbon atom of the aromatic stator portion In FIGS. 4a and 4c, while another is attached to the nitrogen atom of the heterocyclic ring system of the stator in FIG. 4b.

Due to some steric hindrance and the neighboring groups' interaction between the connector portion and stator portion 24a of the active molecule 24, the plane of the connector unit is perpendicular to the plane of the active molecules' main body, with one connecting group pointing up and another down. The angle between the two connecting groups must fall between 60 to 180 degrees.

Several more points are worth mentioning: (1) The connecting unit described in FIGS. 4a-4c does not have to be a benzene ring. Other types of aromatic or non-aromatic hydrocarbon or heterocyclic system can be used, depending on the application. (2) The stator portion of the active molecules does not have to be as exactly described in FIGS. 4a, 4b, and 4c. Other types of aromatic or heterocyclic system can be used, depending on the application. (3) One stator 24a does not have to be linked with four rotors 24c; a stator can link more or fewer rotors, again depending on the application. (4) The rotor 24c and stator 24a portions do not have to be linked by acetylene units; other connecting units known in common organic chemistry can be used also for such connections, depending on the application. The examples depicted in FIGS. 4a-4c are only illustrative of the preferred embodiment, which achieves the objects, features and advantages of present teachings, and it is not intended that the appended claims be limited thereto.

Figure 1:
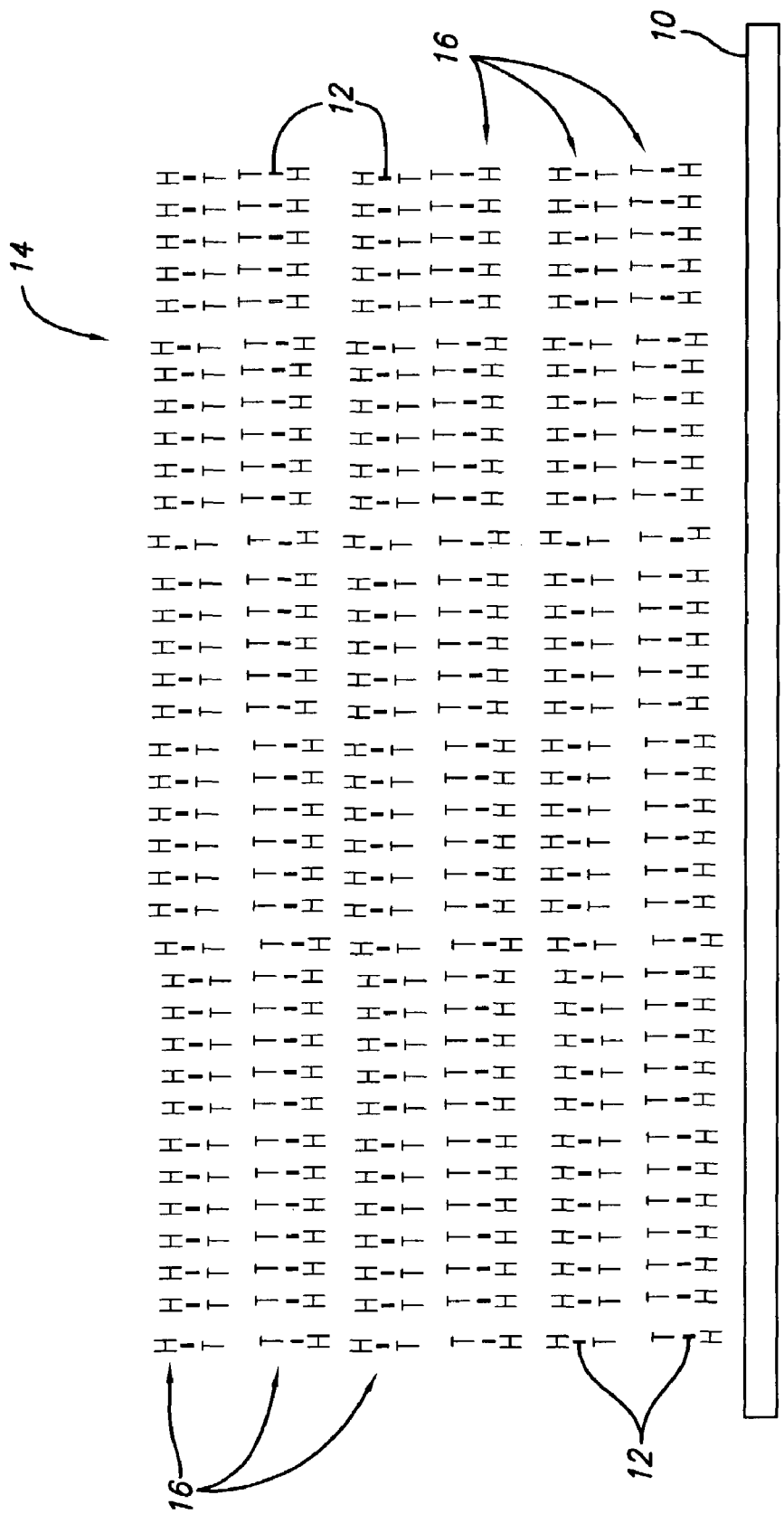
FIG. 1 is a schematic representation showing a conventional head-head/tail-tail arrangement of a multi-layered thin film formed by a repeating Langmuir-Blodgett (L-B) process.

Specifically with reference to FIGS. 4a1 and 4a2, interconnector unit LK is shown in the plane of the structure (FIG. 4a1) and rotated out of the plane of the structure (FIG. 4a2). It does not matter whether all the $LG_2$ moieties are "up" and all the $LG_3$ moieties are "down" or mixed up or down, so long as one of them in each pair is up and the other is down to help form the 3-D assembly. In the rotated out-of-plane configuration (FIG. 4a2), $LG_2$ and $LG_3$ are thus available for connecting to the plane of molecules below (either the seed molecules 22 or the spacer molecules 26, as appropriate) and the plane of molecules above (the spacer molecules 26). The value of m, in which the polymer extends in the X and Y direction, ranges from 1 to 200, although the upper end of the range should not be taken as limiting; there is, in theory, no limitation to the value of the upper end of the range.

Further, with reference to FIGS. 4b1 and 4b2, interconnector unit LK is shown in the plane of the structure (FIG. 4b1) and rotated out of the plane of the structure (FIG. 4b2). In the rotated out-of-plane configuration (FIG. 4b2), $LG_2$ and $LG_3$ are thus available for connecting to the plane of molecules below (either the seed molecules 22 or the spacer molecules 26, as appropriate) and the plane of molecules above (the spacer molecules 26). The value of n, in which the polymer extends in the X and Y direction, is like that of m.

With regard to FIG. 4c, the value of p, in which the polymer extends in the X and Y direction, is like that of m. FIG. 4c shows the in-plane configuration. In the rotated out-of-plane configuration (not shown), $LG_2$ and $LG_3$ are thus available for connecting to the plane of molecules below (either the seed molecules 22 or the spacer molecules 26, as appropriate) and the plane of molecules above (the spacer molecules 26).

FIGS. 5a-5i are schematic figures depicting how this process works by using some very specific molecules with some specific connecting groups. It is worth noticing that the specific example described below uses ionic connections as a preferred way to interlock the molecules between the two adjacent layers. However, other connecting means are possible even though they are not explicitly referred to here. This example is only illustrative of the preferred embodiment, which achieves the objects, features and advantages of present invention, and it is not intended that the present invention be limited thereto.

FIG. 5a depicts a seed molecule 22 for initialization of the organized assembly on the solid substrate, or first electrode, 10, and the seed is made up of three portions: —SH, —COOH, and CP. CP represents an interconnecting portion of the seeds 22, which connects both —SH and —COOH groups together. CP can be, but is not limited to, one of the following: a single σ-bond, a single atom (such as =N—, —O—, —S—), or an atomic group (e.g. —NH—, —N(alkyl)-, —N (aryl)-, —N(acyl)-, —CH=N—, —C(alkyl)=N—, —C(aryl)N—, acetylene, ethylene or substituted ethylene, hydrocarbons (either saturated or unsaturated) or substituted hydrocarbons, heterocyclic system, carboxylic acid or its derivative. In the case of CP being a benzene ring, the seed molecule 22 depicted in FIG. 5a is commercially available 4-mercaptobenzoic acid. SH is a very good SAM candidate; it will preferentially self-assemble onto the Au, Cu, Pt, Ag or other noble metal electrode over —COOH groups. The unattached —COOH group during the SAM will stay on the top of the monolayer of the seed molecules 22 and ready to form an ionic connection with the NH$_2$ group of the active molecule 24 via acid-base interaction.

FIG. 5c represents the active molecule 24, which comprises the main body of the active molecule along with one or more connector units. In fact, the connector unit(s) belong(s) to a part of the main body of the active molecule. Each connector here has two connecting groups (—NH$_2$) pointing in different directions, preferably in opposite directions. Only one of the functional groups can form some kind of connection with the seeds 22 due to steric effects. During a layer-by-layer stepwise assembling, only one —NH$_2$ group of each connector will form ionic bonding with a neighboring top or bottom molecular monolayer each time. Furthermore, in the preferred application of digital dyes, the —NH$_2$ group functions only for the purpose of connecting, and does not have a significant impact on the overall chromophore of the active molecules.

Figures 5H, 5I:
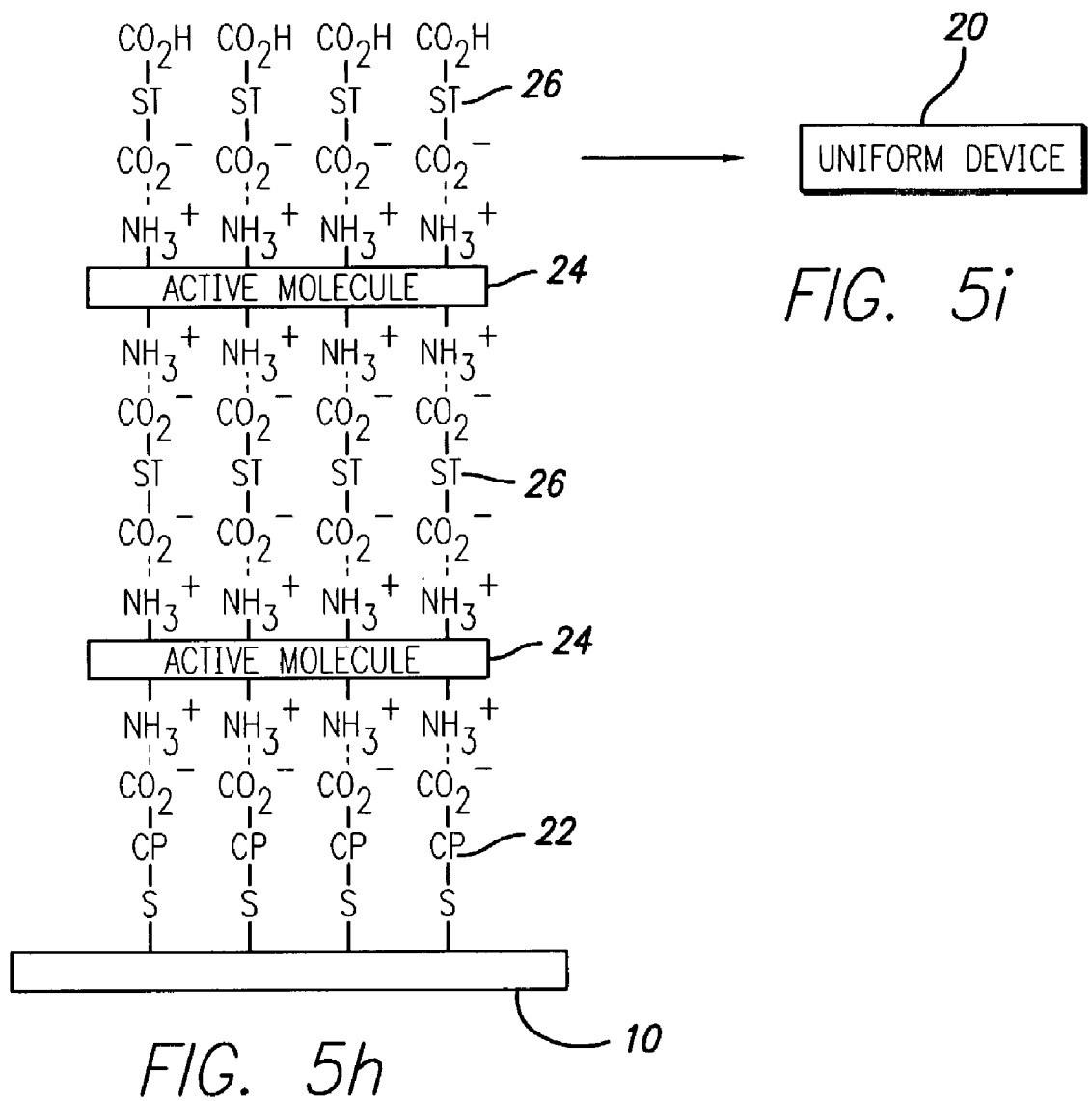

The spacer molecule 26, shown in FIG. 5e, joins the interlayer molecules together in a very precise way. The spacer molecule comprises three portions: two —COOH groups at both ends and an interconnecting portion. Due to steric hindrance and the tendency to form maximum ionic interaction, only one of the two —COOH groups in FIG. 5e will connect with the —NH$_2$ group of the active molecular layer 24 first via acid-base interaction, leaving the another —COOH unattached, as shown in FIG. 5f. Then the unattached —COOH group of the spacer 26 will interact with the new active molecule 24 during a subsequent round of layer assembly (FIGS. 5g-5h) to ultimately form a completed device 20 as shown in FIG. 3i, with the second electrode 28 (not shown) formed on the uppermost layer (as depicted in FIG. 2).

Device Fabrication

Step 1:

The seed molecules 22, shown in FIG. 5a, are first chemically bonded onto the top surface of the bottom electrode 10 via the SAM method. The bottom electrode 10 and associated layer 22 are then rinsed thoroughly with an appropriate solvent or solvent mixture to remove any excess reagent.

Step 2:

The resultant sample (FIG. 5b) is then immersed in a diluted solution of the active molecules 24 (FIG. 5c). The acid-base reaction between the seed molecules 22 and the end-groups of the active molecules 24 takes place. The acid-base ionic interaction is exothermic so that the active molecules 24 will self-organize on the seed molecules 22 to achieve the most stable and lowest energy state possible. A dense and highly uniform (without obvious domain walls) monolayer of the active-molecules thin film (FIG. 5d) with a certain sought-after molecular orientation is formed. The bottom electrode 10 and associated layers 22, 24 are then rinsed thoroughly with an appropriate solvent or solvent mixture to remove any excess reagent.

Step 3:

The spacer molecules 26 are then introduced by dipping the sample (FIG. 5d) into a diluted spacer solution (FIG. 5e). The acid-base reaction takes place selectively between the LG$_3$ group of the active molecules 24 and LG$_4$ group of the spacer molecules 26 (FIG. 5e) to result in another reactive monolayer (FIG. 5f. The bottom electrode 10 and associated layers 22, 24, 26 are then rinsed thoroughly with an appropriate solvent or solvent mixture to remove any excess reagent.

Step 4:

Next, the second layer of active molecules 24 is laid down on top of the spacer layer 26 (FIG. 5f by immersing the resulting intermediate device (FIG. 5f into a diluted solution of the active molecules. The acid-base ionic reaction or metal chelating interaction takes place between the LG$_5$ group of the spacers 26 and LG$_2$ of the active molecules 24. Since the acid-base interaction is exothermic, the active molecules 24 again self-organize to achieve the most stable and lowest energy state possible, forming a dense and highly uniform second layer of the active molecule thin film (FIG. 5g) with the desired molecular orientation. The bottom electrode 10 and associated layers 22, 24, 26, 24 are then rinsed thoroughly with an appropriate solvent or solvent mixture to remove any excess reagent.

Next, a second layer of spacer molecules 26 is laid down on the top of the reactive active molecules monolayer 24 by immersing the resulting intermediate device, shown in FIG. 5g, into a diluted solution of the spacer molecules 26. Again, the exothermic reaction occurs, and the spacer molecules 26 self-organize on top of the active molecules 24 to form a dense and highly uniform second layer of the spacer thin film, shown in FIG. 5h, with the desired molecular orientation. The bottom electrode 10 and associated layers 22, 24, 26, 24, 26 are then rinsed thoroughly with an appropriate solvent or solvent mixture to remove any excess reagent.

By repeating steps 2 and 3 alternatively multiple times and forming the second electrode 28 (not shown) on the uppermost layer, a highly uniform multiplayer molecular thin film device 20 (FIG. 5i) with the sought-after molecular orientation is formed by this controllable, organized molecular assembly method.

FIG. 6a-6k are schematic figures depicting another embodiment of how this process works by using some very specific molecules with some specific linking groups. It is worth noting that the specific example described below uses metal chelating connection as a preferred way to interlock the molecules between the two adjacent layers. However, other connecting means are possible even though they are not described here. This example is only illustrative of the preferred embodiment, which achieves the objects, features and advantages of present teachings, and it is not intended that the appended claims be limited thereto.

FIG. 6a depicts a commercially available cysteine, which serves as a seed molecule 22 for initialization of the organized assembly on the solid substrate, or first electrode, 10. The —SH group of cysteine is a very good SAM candidate; it preferentially self-assembles onto Au, Cu, Pt, Ag or other noble metal electrodes over —NH$_2$ and —COOH groups. The unattached —NH$_2$ and —COOH groups become the uppermost surface of the structure, shown in FIG. 6b, ready to form a semi-metal chelating connection with Cu$^{2+}$ cation in an aqueous spacer solution in the next deposition step.

FIG. 6c depicts a spacer moiety 26, joining the interlayer molecules together in a very precise way. The spacer moiety 26 is a Cu$^{2+}$ salt solution, which is capable of forming a stable metal chelating complex with α-amino acid. Unlike the previous examples in which the spacers 26 are molecules, here they are metal ions. FIG. 6d shows the resulting structure.

Figures 6F, 6G:
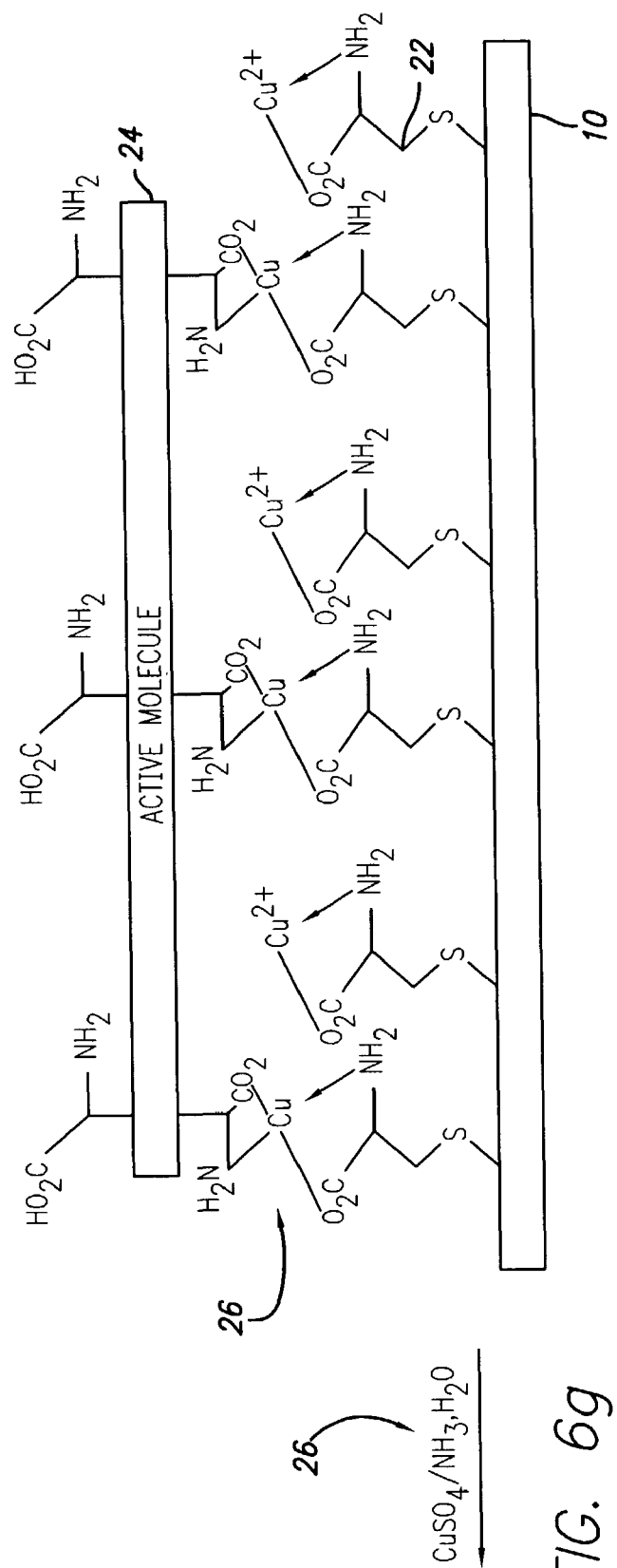

FIG. 6e depicts the active molecules 24, which are made up of the main body of the active molecule along with one or more connector units. In fact, the connector unit(s) belong(s) to a part of the main body of the active molecule 24. Each connector has two sets of α-amino acid connecting groups pointing in different directions, preferably in opposite directions. During a layer-by-layer stepwise assembling, only one set of the α-amino acid groups can preferentially form a metal chelating connection with the spacer functional group due to steric effects. The resultant structure including the layer of active molecules 24 is shown in FIG. 6f. Furthermore, in the preferred digital dye application, the —NH$_2$ functions only as a connecting element. It does not significantly affect the overall chromophore of the active molecules.

Figures 6H, 6I:
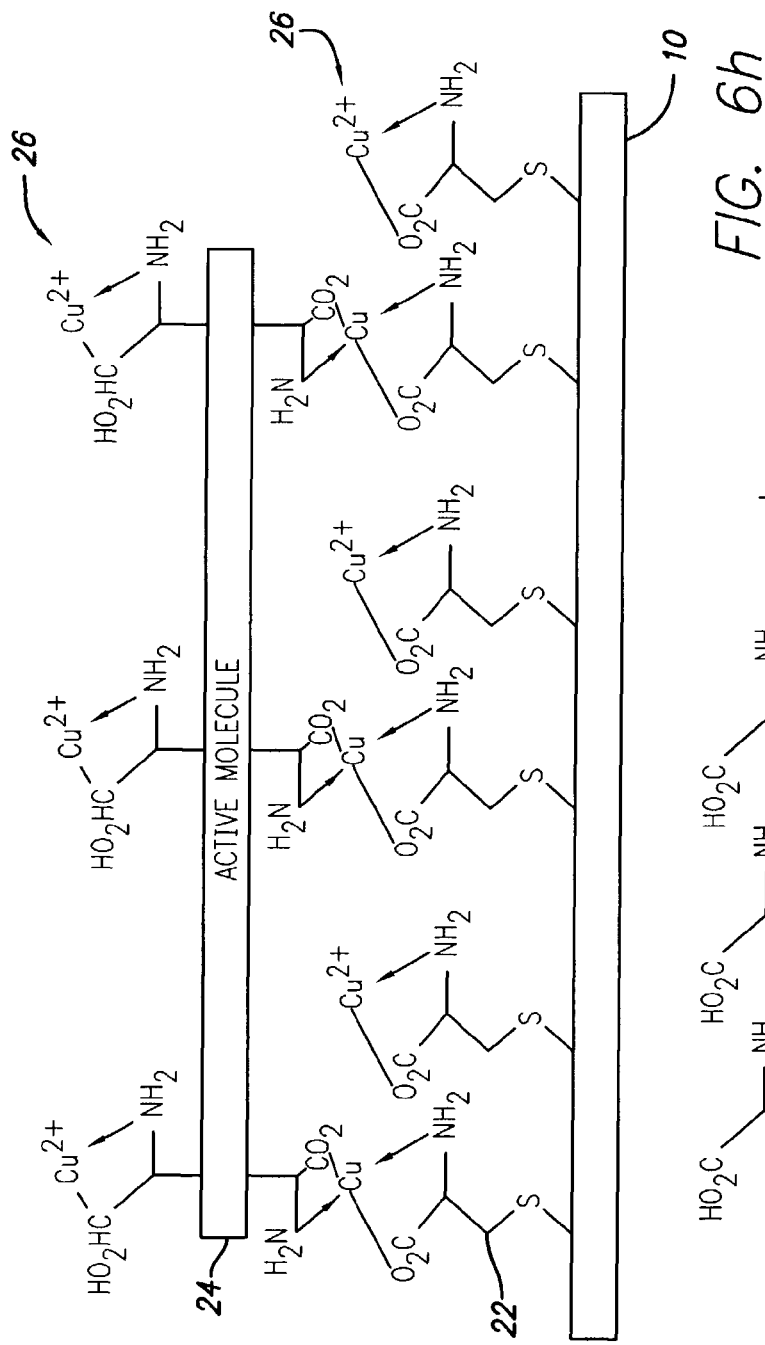

FIG. 6g depicts the spacer moiety 26, which forms the stable metal chelating complex with α-amino acid. FIG. 6h shows the resulting structure.

FIG. 6i depicts the active molecules 24 used to form the next layer of the molecular structure, shown in FIG. 6j. The completed device 20, with second electrode 28 (not shown) formed on the uppermost layer, is shown in FIG. 6k.

Device Fabrication

Step 1:

The seed molecules 22 (FIG. 6a) are first chemically bonded onto the top surface of the bottom electrode 10 via the SAM method. The bottom electrode 10 and associated layer 24 are then rinsed thoroughly with an appropriate solvent or solvent mixture to remove any excess reagent.

Step 2:

The resultant sample (FIG. 6b) is then immersed in a diluted solution of the ionic metal salt solution (FIG. 6c). The metal chelating reaction between the α-amino acid of the seeds 22 and the Cu$^{2+}$ spacers 26 takes place. Since the metal chelating reaction is exothermic, the spacers 26 self-organize on top of the seed molecules 22 under a thermodynamically-controlled equilibrium reaction to achieve the most stable and lowest energy state possible. A dense and highly uniform (without obvious domain walls) layer of the metal semi-chelated thin film (FIG. 6d) with the desired molecular orientation is formed. The bottom electrode 10 and associated layers 22, 26 are then rinsed thoroughly with an appropriate solvent mixture to remove any excess reagent.

Step 3:

The active molecules 24 are then introduced by immersing the sample (FIG. 6d) into a diluted active molecular solution (FIG. 6e). The metal chelating reaction will take place selectively between the semi-metal complex (spacers 26) of (FIG. 6d) and the α-amino acid group of the active molecule 24. Once again, since the metal chelating reaction is exothermic; the active molecules 24 self-organize under a thermodynamically-controlled equilibrium reaction, achieving the most stable and lowest energy state possible. This leads to the formation of a dense and highly uniform (without obvious domain walls) layer of the active molecules 24 thin film (FIG. 6f) with the desired molecular orientation. The bottom electrode 10 and associated layers 22, 26, 24 are then rinsed thoroughly with an appropriate solvent or solvent mixture to remove any excess reagent.

Step 4:

Then the sample is prepared for next layer assembly by repeating step 2 to form a semi-chelating metal complex (FIG. 6g). The bottom electrode 10 and associated layers 22, 26, 24, 26 are then rinsed thoroughly with an appropriate solvent or solvent mixture to remove any excess reagent.

Step 5:

The second layer of the active molecules 24 is deposited by repeating step 3, yielding (FIG. 6h). The bottom electrode 10 and associated layers 22, 26, 24, 26, 24 are then rinsed thoroughly with an appropriate solvent or solvent mixture to remove any excess reagent.

By repeating steps 2 and 3 alternatively a multiple times, a highly uniform multiplayer molecular thin film device 20 (FIG. 6k) with the desired molecular orientation is formed by this controllable, organized molecular assembly method.

Variations

The processes described herein relate to a preferred embodiment of the organized 3-D molecular assembly that is most useful for digital dyes. It is contemplated that other molecular multi-layer structures stemming from the processes disclosed herein may be fabricated. In this context, the following discussion is included as part of these teachings:

The active molecules 24 and the spacer moieties 26 do not have to be the same throughout the device processing cycle. Different active molecules 24 and/or spacer moieties 26 may be used in different steps so as to produce a heterogeneous molecular sandwich. In fact, in certain applications, it may be advantageous to make use of this processing capability. For this to be feasible, one obvious requirement is that the active molecules 24 and the spacer moieties 26 have to be mutually compatible so that sequential self-assembly can occur.

Though the rotor-stator (RS) type of molecules has been extensively referred to herein, the process described herein is by no means restricted to such molecules. The RS type of molecules serves only as an illustrative example. Other suitable non-RS molecules, oligomers, polymers, biological molecules/material, organometalics, nano particles, or carbon nano-tubes, etc. may be substituted in place thereof.

The multi-layer molecular structures discussed in FIGS. 3-6 are not the only possible arrangements, although they are preferred embodiments. Under some conditions, it may be possible to eliminate the seed 22 monolayer or rearrange their order, as shown in FIGS. 7a-7c. Departing from the preferred "Seeds-Active Molecules-Spacers" order, FIG. 7a depicts one variant. In FIG. 7a, once the initial seed molecular layer 22 is formed, then the spacer layer 26 and active layer 24 alternate, with the first spacer layer being formed on the seed layer 22. It is also possible to eliminate the seed monolayer 22 altogether when suitable active molecules 24 are found which could bond directly to the solid substrate 10, and whose molecular orientation could be controlled as well. This configuration is depicted in FIG. 7b, which shows alternating active molecular layers 24 and spacer moiety layers 26. Of course, the potential existence of spacer molecules that could meet the desired objectives should not be excluded from these teachings. FIG. 7c shows an alternate structure when some suitable spacer molecules are found or synthesized, alternating with active molecular layers 24. In all cases described herein, the second electrode 28 may be formed on either the active molecular layer 24 or the spacer moiety layer 26.

Special surface treatment or coating done on the solid substrate, or first electrode, 10 may facilitate the bonding process. Such surface treatment, combined with other suitable molecules, make it possible to implement the alternate molecular multi-layer structures shown in FIGS. 7a-7c.

The teachings herein provide a simple and effective means to assemble molecules in a three-dimensional device in an exact, organized, and controllable manner. The approach taught herein is a simple, easy, and tolerable process, and can be readily scaled up for industrial applications. The three-dimensional molecular assembly can be used in a variety of areas other than molecular electronics, including information storage and display. The teachings herein also enable the custom fabrication of a highly uniform material with certain desirable properties. The process described herein enables the control of the material preparation very precisely, specifically, the orientation of the molecules, the film thickness and its properties, the number of molecular layers, etc., thus permitting organizing a molecular assembly on a solid substrate in a certain controllable, desirable way.

INDUSTRIAL APPLICABILITY

The reaction schemes disclosed and claimed herein are expected to find use in the construction of 3-D networks, useful in moletronic applications.

What is claimed is:

1. A three-dimensional molecular switch assembly, formed on a substrate, said molecular switch assembly comprising:
a first monolayer of seed molecules for initiating self-assembled molecular growth, said first monolayer formed on said substrate;
a second monolayer of active molecules comprising a plurality of rotor moieties and stator moieties, with one rotor moiety supported between two stator moieties, said second monolayer of active molecules formed on said first monolayer of seed molecules, with a one-to-one correspondence between molecules in said first monolayer and said second monolayer;
a third monolayer of spacer molecules, formed on said second monolayer of active molecules, with a one-to-one correspondence between molecules in said second monolayer and said third monolayer; and
a plurality of alternating second monolayers and third monolayers having said one-to-one correspondence,
wherein said active molecules are switchable between two different states by an applied external electric field.

2. The three-dimensional molecular switch assembly of claim 1 wherein said seed molecules comprise at least one connector portion and an interconnecting portion.

3. The three-dimensional molecular switch assembly of claim 2 wherein said seed molecules comprise two asymmetric connector portions, on opposite sides of said interconnecting portion.

4. The three-dimensional molecular switch assembly of claim 1 wherein said active molecules comprise said rotor moieties and said stator moieties, and at least one connector portion connected to at least one said stator moiety.

5. The three-dimensional molecular switch assembly of claim 4 wherein said active molecules comprise two connector portions connected to said at least one stator moiety, on opposite sides thereof to form a first connector portion and a second connector portion.

6. The three-dimensional molecular switch assembly of claim 5 wherein each said connector portion has at least one functional group thereon, which is the same for said first connector portions and said second connector portions.

7. The three-dimensional molecular switch assembly of claim 5 wherein said first connector portions each have at least one first functional group thereon, which is the same for all first connector portions and wherein said second connector portions each have at least one second functional group thereon, which is the same for all second connector portions, wherein said at least one first functional group is different than said at least one second functional group.

8. The three-dimensional molecular switch assembly of claim 4 wherein not all stator moieties have any said connector portions connected thereto.

9. The three-dimensional molecular switch assembly of claim 1 wherein said spacer molecules comprise at least one connector portion and an interconnecting portion.

10. The three-dimensional molecular switch assembly of claim 9 wherein said spacer molecules comprise two connector portions, on opposite sides of said interconnecting portion.

11. The three-dimensional molecular switch assembly of claim 10 wherein each said connector portion has at least one functional group thereon, which is the same for said first connector portions and said second connector portions.

12. The three-dimensional molecular switch assembly of claim 10 wherein said first connector portions each have at least one first functional group thereon, which is the same for all first connector portions and wherein said second connector portions each have at least one second functional group thereon, which is the same for all second connector portions, wherein said at least one first functional group is different than said at least one second functional group.

13. The three-dimensional molecular switch assembly of claim 1 wherein said substrate comprises a first electrode and wherein said molecular assembly further comprises a second electrode formed on an uppermost monolayer.

14. The three-dimensional molecular switch assembly of claim 13 wherein said third monolayer is formed on said first monolayer, said second monolayer is formed on said third monolayer, with subsequent alternating third monolayers and second monolayers, with said second electrode formed on said uppermost monolayer.

15. The three-dimensional molecular switch assembly of claim 13 wherein said seed layer is omitted, said second monolayer is formed directly on said first electrode, and said third monolayer is formed on said second monolayer, with subsequent alternating second monolayers and third monolayers, with said second electrode formed on said uppermost monolayer.

16. The three-dimensional molecular switch assembly of claim 13 wherein said seed layer is omitted, said third monolayer is formed directly on said first electrode, and said second monolayer is formed on said third monolayer, with subsequent alternating third monolayers and second monolayers, with said second electrode formed on said uppermost monolayer.

17. A method for fabricating a three-dimensional switch molecular assembly, formed on a substrate, said method comprising:
forming on said substrate a first monolayer of seed molecules for initiating self-assembled molecular growth;
forming, via molecular self-assembly, on said first monolayer a second monolayer of active molecules comprising a plurality of rotor moieties and stator moieties, with one rotor moiety supported between two stator moieties, with a one-to-one correspondence between molecules in said first monolayer and said second monolayer;
forming, via molecular self-assembly, on said second monolayer a third monolayer of spacer molecules, with a one-to-one correspondence between molecules in said second monolayer and said third monolayer; and
forming, via molecular self-assembly, a plurality of alternating second monolayers and third monolayers having said one-to-one correspondence,
wherein said active molecules are switchable between two different states by an applied external electric field.

18. The method of claim 17 wherein said seed molecules comprise at least one connector portion and an interconnecting portion.

19. The method of claim 18 wherein said seed molecules comprise two asymmetric connector portions, on opposite sides of said interconnecting portion.

20. The method of claim 17 wherein said active molecules comprise said rotor moieties and said stator moieties, and at least one connector portion connected to at least one said stator moiety.

21. The method of claim 20 wherein said active molecules comprise two connector portions connected to said at least one stator moiety, on opposite sides thereof to form a first connector portion and a second connector portion.

22. The method of claim 21 wherein each said connector portion has at least one functional group thereon, which is the same for said first connector portions and said second connector portions.

23. The method of claim 21 wherein said first connector portions each have at least one first functional group thereon, which is the same for all first connector portions and wherein said second connector portions each have at least one second functional group thereon, which is the same for all second connector portions, wherein said at least one first functional group is different than said at least one second functional group.

24. The method of claim 20 wherein not all stator moieties have any said connector portions connected thereto.

25. The method of claim 17 wherein said spacer molecules comprise at least one connector portion and an interconnecting portion.

26. The method of claim 25 wherein said spacer molecules comprise two connector portions, on opposite sides of said interconnecting portion.

27. The method of claim 26 wherein each said connector portion has at least one functional group thereon, which is the same for said first connector portions and said second connector portions.

28. The method of claim 26 wherein said first connector portions each have at least one first functional group thereon, which is the same for all first connector portions and wherein said second connector portions each have at least one second functional group thereon, which is the same for all second connector portions, wherein said at least one first functional group is different than said at least one second functional group.

29. The method of claim 17 wherein said substrate comprises a first electrode and wherein said method further comprises forming a second electrode on an uppermost monolayer.

30. The method of claim 29 wherein said third monolayer is formed on said first monolayer, said second monolayer is formed on said third monolayer, with subsequent alternating third monolayers and second monolayers, with said second electrode formed on said uppermost monolayer.

31. The method of claim 29 wherein said seed layer is omitted, said second monolayer is formed directly on said first electrode, and said third monolayer is formed on said second monolayer, with subsequent alternating second monolayers and third monolayers, with said second electrode formed on said uppermost monolayer.

32. The method of claim 29 wherein said seed layer is omitted, said third monolayer is formed directly on said first electrode, and said second monolayer is formed on said third monolayer, with subsequent alternating third monolayers and second monolayers, with said second electrode formed on said uppermost monolayer.

33. The three-dimensional molecular switch assembly of claim 1 as a bi-stable molecular color switch.

34. The three-dimensional molecular switch assembly of claim 33 wherein said bi-stable molecular color switch is switchable by an applied external electric field between a colored state and a transparent state.

35. The three-dimensional molecular switch assembly of claim 34 wherein color change occurs through a molecular conformation change that alters the degree of electron conjugation across a said active molecule and, thereby, the highest occupied molecular orbital—lowest unoccupied molecular orbital states of said active molecule.

36. The three-dimensional molecular switch assembly of claim 1 as a bi-stable molecular switch.

37. The method of claim 17 wherein said three-dimensional molecular switch assembly is a bi-stable molecular color switch.

38. The method of claim 37 wherein said bi-stable molecular color switch is switchable by an applied external electric field between a colored state and a transparent state.

39. The method of claim 38 wherein color change occurs through a molecular conformation change that alters the degree of electron conjugation across a said active molecule and, thereby, the highest occupied molecular orbital—lowest unoccupied molecular orbital states of said active molecule.

40. The method of claim 17 wherein said three-dimensional molecular switch assembly is a bi-stable molecular switch.

* * * * *